(12) United States Patent
Komino et al.

(10) Patent No.: US 7,033,444 B1
(45) Date of Patent: Apr. 25, 2006

(54) PLASMA PROCESSING APPARATUS, AND ELECTRODE STRUCTURE AND TABLE STRUCTURE OF PROCESSING APPARATUS

(75) Inventors: Mitsuaki Komino, Nakano-ku (JP); Yasuharu Sasaki, Tsukui-gun (JP); Kyo Tsuboi, Tsukui-gun (JP); Hideaki Amano, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 09/667,770

(22) Filed: Sep. 22, 2000

Related U.S. Application Data

(63) Continuation of application No. PCT/JP00/04011, filed on Jun. 20, 2000.

(30) Foreign Application Priority Data

| Jun. 21, 1999 | (JP) | ............................................. 11-173613 |
| Jun. 5, 2000 | (JP) | ....................................... 2000-168297 |

(51) Int. Cl.
*C23C 16/509* (2006.01)
*C23F 1/00* (2006.01)
*H01L 21/306* (2006.01)

(52) U.S. Cl. ........................ 118/725; 118/724; 118/728; 118/729; 118/723 E; 156/345.43; 156/345.51; 156/345.52; 156/345.53; 156/345.54

(58) Field of Classification Search ................. 156/345, 156/293, 345.53, 345.27; 118/722 I, 725, 118/723 E, 724, 69; 29/25.4; 361/234, 235; 165/80.1

See application file for complete search history.

(56) References Cited

U.S. PATENT DOCUMENTS 4,565,601 A * 1/1986 Kakehi et al. .......... 156/345.27

4,771,730 A * 9/1988 Tezuka ........................ 118/724

(Continued)

FOREIGN PATENT DOCUMENTS

| EP | 0 488 307 A2 | 6/1992 |
| EP | 0 488 307 A3 | 6/1992 |
| JP | 5-315262 | 11/1993 |
| JP | 6-163433 | 6/1994 |
| JP | 06232082 | 8/1994 |
| JP | 6-252055 | 9/1994 |
| JP | 7-86185 | 3/1995 |
| JP | 9-97830 | 4/1997 |

OTHER PUBLICATIONS

D.R. Write, et al, "Low temperature etch chuck: Modeling and experimental results of heat transfer and wafer temperature"; J.Vac. Sci. Technol. A 10(4), Jul./Aug., 1992. pp. 1065–1070.*

CRC Handbook of Chemistry and Physics, Robert C. Weast (Ed.), 63rd Ed. 1982–1983; p. E–9.*

EPO Search Report, "00937315.0–2119/JP0004011," (Sep. 8, 2004).

*Primary Examiner*—Rudy Zervigon
(74) *Attorney, Agent, or Firm*—Pillsbury Winthrop LLP

(57) ABSTRACT

An electrode structure used in a plasma processing apparatus which performs a predetermined process on an object (W) to be processed by using a plasma in a process chamber (26) in which a vacuum can be formed. An electrode unit (38) has a heater unit (44) therein. A cooling block (40) having a cooling jacket (58) is joined to the electrode unit (38) so as to cool the electrode unit. A heat resistant metal seal member (66A, 66B) seals an electrode-side heat transfer space (62, 64) formed between the electrode unit and the cooling block. Electrode-side heat transfer gas supply means (94) supplies a heat transfer gas to the electrode-side heat transfer space. Accordingly, a sealing characteristic of the electrode-side heat transfer space does not deteriorate even in a high temperature range such as a temperature higher than 200° C. and, for example, a range from 350° C. to 500° C., and the heat transfer gas does not leak.

20 Claims, 14 Drawing Sheets

U.S. PATENT DOCUMENTS

| | | | | |
|---|---|---|---|---|
| 4,949,783 A | * | 8/1990 | Lakios et al. | 118/69 |
| 5,062,386 A | * | 11/1991 | Christensen | 118/725 |
| 5,169,407 A | * | 12/1992 | Mase et al. | 29/25.01 |
| 5,177,878 A | * | 1/1993 | Visser | 165/80.1 |
| 5,255,153 A | * | 10/1993 | Nozawa et al. | 361/235 |
| 5,320,982 A | * | 6/1994 | Tsubone et al. | 118/724 |
| 5,376,213 A | * | 12/1994 | Ueda et al. | 156/345.53 |
| 5,382,311 A | * | 1/1995 | Ishikawa et al. | 118/723 E |
| 5,529,657 A | * | 6/1996 | Ishii | 156/345.26 |
| 5,535,090 A | * | 7/1996 | Sherman | 361/234 |
| 5,548,470 A | * | 8/1996 | Husain et al. | 361/234 |
| 5,556,476 A | * | 9/1996 | Lei et al. | 118/728 |
| 5,567,267 A | * | 10/1996 | Kazama et al. | 118/724 |
| 5,625,526 A | * | 4/1997 | Watanabe et al. | 361/234 |
| 5,633,073 A | * | 5/1997 | Cheung et al. | 156/293 |
| 5,665,166 A | * | 9/1997 | Deguchi et al. | 118/724 |
| 5,740,016 A | | 4/1998 | Dhindsa | 361/704 |
| 5,745,331 A | * | 4/1998 | Shamouilian et al. | 361/234 |
| 5,775,416 A | * | 7/1998 | Heimanson et al. | 118/725 |
| 5,792,304 A | * | 8/1998 | Tamura et al. | 156/345 |
| 5,800,618 A | * | 9/1998 | Niori et al. | 118/723 E |
| 5,835,334 A | * | 11/1998 | McMillin et al. | 361/234 |
| 5,846,375 A | * | 12/1998 | Gilchrist et al. | 118/723 E |
| 5,935,460 A | * | 8/1999 | Mori et al. | 219/121.59 |
| 5,961,774 A | * | 10/1999 | Tamura et al. | 156/345 |
| 6,048,434 A | * | 4/2000 | Tamura et al. | 156/345 |
| 6,095,083 A | * | 8/2000 | Rice et al. | 118/732 I |
| 6,214,162 B1 | * | 4/2001 | Koshimizu | 156/345 |

* cited by examiner

HEAT TRANSFER GAS

PLASMA PROCESSING APPARATUS, AND ELECTRODE STRUCTURE AND TABLE STRUCTURE OF PROCESSING APPARATUS

This is a continuation of International Application Ser. No. PCT/JP00/04011, filed Jun. 20, 2000, which, in turn, is based on Japanese Patent Application Nos. 11-173613, filed Jun. 21, 1999, and 2000-168297, filed Jun. 5, 2000.

TECHNICAL FIELD

The present invention relates to a processing apparatus such as a plasma processing apparatus and, more particularly, to a structure of an electrode and a structure of a placement table that are suitable for the plasma processing apparatus.

BACKGROUND ART

Generally, in a manufacturing process of a semiconductor integrated circuit, various processes, such as a film deposition process, an etching process or an oxidation-diffusion process, are repeatedly performed with respect to a semiconductor wafer, which is an object to be processed. In such kinds of processes, in a case in which there is no element or arrangement or member that receives a thermal damage in a wafer such as a case in which an oxidation film is deposited on a bare wafer, there is no problem if a heat treatment is performed at a high temperature of, for example, 800° C. to 900° C. However, for example, when an interlayer insulating film or the like is formed to make a circuit element to be multilayer, there is a problem in that a circuit element or structure is damaged if a wafer is heated to a high temperature of 800° C. to 900° C. as mentioned above. In order to solve such a problem, a CVD (chemical vapor deposition) is performed by using a plasma at a temperature in a low-temperature range such as, for example, 300° C. which is not so high.

FIG. 1 is an illustration of a structure of a conventional apparatus that performs the above-mentioned plasma CVD. First, a lower electrode unit 4, which also serves as a placement table, is situated in a process chamber 2 in which a vacuum can be created. A heater unit 6 such as a sheath heater is embedded in the lower electrode unit 4 in an insulated state. Specifically, the above-mentioned heater unit 6 is embedded by being cast into an aluminum material or the like. Additionally, an electrostatic chuck 8, which is made of ceramics, is provided on an upper surface of the lower electrode unit 4, which is made of aluminum, by being bonded by brazing and the like, the electrostatic chuck being formed by embedding an electrostatic chuck electrode in a ceramics material. The semiconductor wafer W is held on the electrostatic chuck 8 by an electrostatic attracting force.

Additionally, a cooling block 12 having a cooling Jacket 10 therein is provided in a lower portion of the above-mentioned lower electrode unit 4. The wafer W is maintained at an optimum temperature by controlling the above-mentioned cooling jacket 10 and the heater unit 6.

Since a heat transfer space 14, which is a small gap, is formed between the lower electrode unit 4 which decreases the heat transfer efficiency, an attempt is made to improve the efficiency of heat transfer by sealing the heat transfer space 14 by a seal member 16 such as an O-ring and introducing a heat-transfer gas, which is an inert gas such as Ar gas, He gas or nitrogen gas.

Additionally. An upper electrode unit 18 is provided on the ceiling of the process chamber 2, the upper electrode unit being positioned to face the above-mentioned lower electrode unit 4. A heater unit 20 such as a sheath heater is also embedded in the upper electrode unit 18 by being cast into an aluminum material or the like. Additionally, a high-frequency source 22 is connected to the upper electrode unit 18 so as to apply a high-frequency voltage for generating a plasma, and a predetermined process is applied to the wafer W by generating a plasma between the upper electrode unit 18 and the lower electrode unit 4.

In a case in which a process temperature of the semiconductor wafer is relatively low, for example, when the process temperature is lower than about 200° C., an influence of the process temperature to a member provided in the process chamber 2 is not large. However, in order to increase a film deposition rate or improve a film quality in a film deposition process for example, there is a case in which the process temperature is increased to a temperature greater than 200° C., that is, a temperature ranging from 350° C. to 500° C. in a range in which an element or a construction in a lower layer is not damaged.

In such a high temperature range, there is a problem in that a sealed gas leaks due to deterioration of the sealing characteristic of the sealing member 16 such as an O-ring sealing the heat transfer space 14 due to a thermal degradation. If the sealing characteristic of the sealing member 16 is deteriorated, the inert gas sealed in the heat transfer space 14 flows out, which results in deterioration of the efficiency of heat transfer. As a result, the accuracy of control of the temperature of the wafer W may be decreased, or a film deposition gas in the process chamber 2 may be diluted by the heat transfer gas, for example, in a film deposition process. In order to prevent such a problem, a flow rate of the film deposition gas must be increased more than a stoichiometric ratio, and, thus, there is a problem in that consumption of the film deposition gas is increased.

Additionally, since a pressure sensor cannot be provided to the heat-transfer space 14, which is heated to a high temperature, a pressure of the heat-transfer gas supply to the heat transfer space 14 is monitored by a supply source so as to control the supply pressure to become appropriate. However, in such a structure, a pressure in the area to be controlled is not directly detected, the controllability of the gas pressure must be deteriorated.

It should be noted that the present inventor suggested, in Japanese Laid-Open Patent Application No. 6-232082, a sealing structure for performing a process in a low-temperature state, which is a sealing structure under an ultra low-temperature environment such as a cooling device, which performs cooling by using liquefied nitrogen.

DISCLOSURE OF THE INVENTION

It is an object of the present invention to provide an improved and useful plasma processing apparatus in which the above-mentioned problems are eliminated.

A more specific object of the present invention is to provide an electrode structure and a placement table structure of a plasma processing apparatus in which a seal characteristic is not deteriorated in a high-temperature range exceeding 200° C., which results in less leakage of a heat transfer gas.

Another object of the present invention is to provide an electrode structure and a placement table structure of a plasma processing apparatus which prevents a deformation of an insulating member provided therein and enables a uniform contact with a member to be contacted, thereby improving the uniformity of a temperature distribution in a surface of an object to be processed.

Additionally, another object of the present invention is to provide an electrode structure and a placement table structure of a plasma processing apparatus which can remarkably suppress generation of a leak paths by forming a soft metal film or soft metal layer, which is made of a low melting point material and is softened at a process temperature, on a surface of a heat resistant metal seal member or a contact surface of a member to which the seal member contacts.

Additionally, another object of the present invention is to provide an electrode structure and a placement table structure of a plasma processing apparatus, which enables an improvement in a corrosion resistance with respect to a fluoride gas by forming a fluoride passivation film on an entire exposed surface of the heat resistant metal seal member.

Additionally, another object of the present invention is to provide an electrode structure and a placement table structure of a plasma processing apparatus which enables an improvement in the temperature controllability of an object to be processed by setting the surface roughness of a member defining a heat transfer space to be less than a predetermined value so as to improve the coefficient of heat transfer.

Additionally, another object of the present invention is to provide an electrode structure and a placement table structure of a plasma processing apparatus which enables an improvement in uniformity of a temperature distribution in a surface of an object to be processed by promoting a release of heat from the electrode or the central portion of a placement table that tend to be at a high temperature by a blower or by cooling a column supporting the placement table.

In order to achieve the above-mentioned objects, there is provided according to the present invention an electrode structure used in a plasma processing apparatus which performs a predetermined process on an object to be processed by using a plasma in a process chamber in which a vacuum can be formed, the electrode structure is characterized by comprising an electrode unit having a heater unit therein; a cooling block joined to the electrode unit and having a cooling jacket which cools the electrode unit; a heat resistant metal seal member for sealing an electrode-side heat transfer space formed between the electrode unit and the cooling block; and electrode-side heat transfer gas supply means for supplying a heat transfer gas to the electrode-side heat transfer space.

As mentioned above, by using the heat resistant metal seal member, a high sealing effect for the electrode-side heat transfer apace can be maintained in a high temperature range such as a temperature higher than 200° C. and, for example, a range from 350° C. to 500° C.

Additionally, there is provided according to another aspect of the present invention an electrode structure used in a plasma processing apparatus which performs a predetermined process on an object to be processed by using a plasma in a process chamber in which a vacuum can be formed, the electrode structure is characterized by comprising: an electrode unit having a heater unit therein; a cooling block joined to the electrode unit and having a cooling jacket which cools the electrode unit; a labyrinth heat transfer space formed by a concentric or spiral groove provided on at least one of opposite surfaces of the electrode unit and the cooling block; and electrode-side heat transfer gas supply means for supplying a heat transfer gas to the labyrinth heat transfer space.

As mentioned above, by providing the labyrinth heat transfer space between the joining surfaces of the electrode unit and the cooling block, a high sealing effect for the heat transfer apace formed between said electrode unit and said cooling block can be maintained in a high temperature range such as a temperature higher than 200° C. and, for example, a range from 350° C. to 500° C.

Additionally, an insulating member may be provided between the electrode unit and the cooling block, and the heat transfer space may be divided into an upper space and a lower space by the insulating member. In such a case, since both the upper space and the lower space are sealed by the heat transfer metal seal member, a high sealing effect at a high temperature range can be maintained.

The insulating member may be made of a material having a coefficient of thermal conductivity of more than 80 W/mK. Accordingly, an amount of warp of the insulating member can be suppressed. As a result, the insulating member equally contact a member to be contacted, thereby enabling an improvement of uniformity of a temperature distribution in a surface of the object to be processed. The insulating member may be made of aluminum nitride (AlN).

Additionally, a contact rate of joining surfaces of members, which are joined to define the heat transfer space, may be set to fall within a range from 40% to 80%. According to this, the uniformity of a temperature distribution in a surface of the object to be processed can be further improved since the heat transfer gas can flow substantially uniformly within the surface without excessively increasing the heat resistance.

Further, a surface roughness of a member defining the heat transfer space may be set smaller than 2.0 im. A thermal conductivity can be improved by controlling the surface roughness of the member defining the heat transfer space to be smaller than a predetermined value. Additionally, an improvement of controllability of the temperature of the object to be processed can be achieved.

Additionally, the heat resistant metal seal member may be a heat resistant metal film having a ring-like cross section, a low melting point material being confined in the metal film. Thereby, traceability of the surface of the seal member is increased, which enables a further improvement of the sealing characteristic. The surface of the heat resistant metal seal member may be covered by a soft metal film made of a low melting point material, which is softened at a process temperature of the object to be processed. According to this, the low melting point material is softened when being processed and a cut in the surface which contacts the seal member is filled by the softened material which eliminates a leak path, thereby enabling prevention of the heat transfer gas from leaking through the cut.

Additionally, the surface of the member contacting the heat resistant metal seal member may be covered by a soft metal layer made of a low melting point material, which is softened at a process temperature of the object to be processed. Also in this case, the low melting point material is softened when being processed and a cut in the surface which contacts the seal member is filled by the softened material which eliminates a leak path, thereby enabling prevention of the heat transfer gas from leaking through the cut.

Additionally, the surface of the heat resistant metal seal member may be covered by a fluoride passivation film having a corrosion resistance with respect a fluoride gas. This enables an improvement of the corrosion resistance with respect to the fluoride gas. The fluoride passivation film may be made of fluoride nickel.

The heater unit may be divided into concentric zones, and the divided zones may be controllable on an individual basis.

The electrode unit may be an upper electrode unit positioned above the object to be processed.

Additionally, the electrode unit may be a lower electrode unit which also serves as a placement table on which the object to be processed is placed, and the electrode structure may further comprise an electrostatic chuck which is joined to an upper surface of the lower electrode unit so as to attract the object to be processed and chuck-side heat transfer gas supply means for supplying a heat transfer gas to a chuck-side heat transfer space formed between the electrostatic chuck and the object to be processed.

Additionally, at least one of the electrode-side heat transfer space, the labyrinth heat transfer space and the chuck-side heat transfer space may be provided with a heat resistant pressure sensor, and an amount of gas supplied by the corresponding heat transfer gas supply means may be controlled based on an output of the heat resistant pressure sensor. According to this, the controllability of the gas pressure can be improved since the gas pressure in the space to be controlled is measured by the heat resistant pressure sensor.

Additionally, the center of the electrode unit may be held by a hollow column, and gas blower means may be provided in the column for promoting a release of heat by blowing a gas toward the center of a back surface of the electrode unit. According to this, the uniformity of the temperature distribution in the surface of the object to be processed can be improved since a release of heat from the center portion of the placement table, which tends to be a high temperature, can be promoted.

Additionally, the center of the electrode unit may be held by a column, and the column may be connected to the cooling block via a heat conductive member. In this case, the uniformity of the temperature distribution in the surface of the object to be processed can also be improved since a release of heat from the center portion of the placement table can be promoted.

Additionally, there is provided according to another aspect of the present invention a placement table structure used for a processing apparatus performing a predetermined process on an object to be processed in a process chamber in which a vacuum can be formed, the placement table structure is characterized by comprising: a placement table having a heater unit therein so as to heat the object to be processed; a cooling block joined to the placement table and having a cooling jacket which cools the placement table; a heat resistant metal seal member for sealing a heat transfer space formed between the placement table and the cooling block; and heat transfer gas supply means for supplying a heat transfer gas to the heat transfer space.

Accordingly, by using the heat resistant metal seal member, the sealing characteristic of the heat transfer space can be maintained high even in a high temperature range, for example, from 350° C. to 500° C., which is higher than 200° C.

Additionally, there is provided according to another aspect of the present invention a placement table structure used for a processing apparatus performing a predetermined process on an object to be processed in a process chamber in which a vacuum can be formed, the placement table structure is characterized by comprising: a placement table having a heater unit therein so as to heat the object to be processed; a cooling block joined to the placement table and having a cooling jacket which cools the placement table; a labyrinth heat transfer space formed by a concentric or spiral groove provided on at least one of opposite surfaces of the placement table and the cooling block; and heat transfer gas supply means for supplying a heat transfer gas to the labyrinth heat transfer space.

Accordingly, by providing the labyrinth heat transfer space between the contacting surfaces of the placement table and the cooling block, the sealing characteristic of the heat transfer space formed between the placement table and the cooling block can be maintained high even in a high temperature range, for example, from 350° C. to 500° C., which is higher than 200° C.

Additionally, there is provided according to another aspect of the present invention a plasma processing apparatus characterized by comprising: a process chamber in which a vacuum can be formed; an electrode structure according to the above-mentioned present invention; and a high-frequency source applying a high-frequency voltage to the electrode structure.

Further, there is provided according to another aspect of the present invention a processing apparatus characterize by comprising: a process chamber in which a vacuum can be formed; and a placement table structure according to the present invention.

BEST MODE FOR CARRYING OUT THE INVENTION

A description will be given below, with reference to the drawings, of a plasma processing apparatus according to an embodiment of the present invention.

Figure 1:
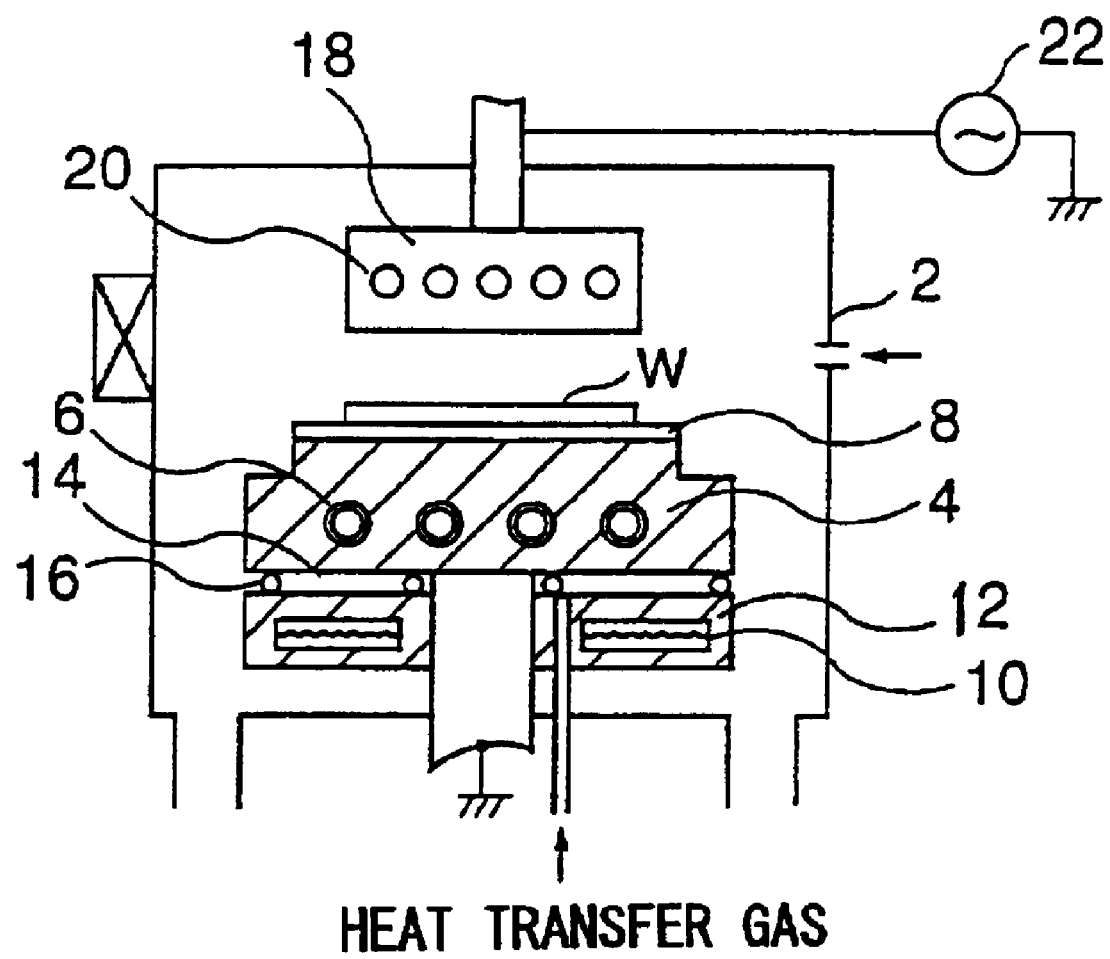
FIG. 1 is a structural view of a conventional plasma CVD processing apparatus.
Figure 2:
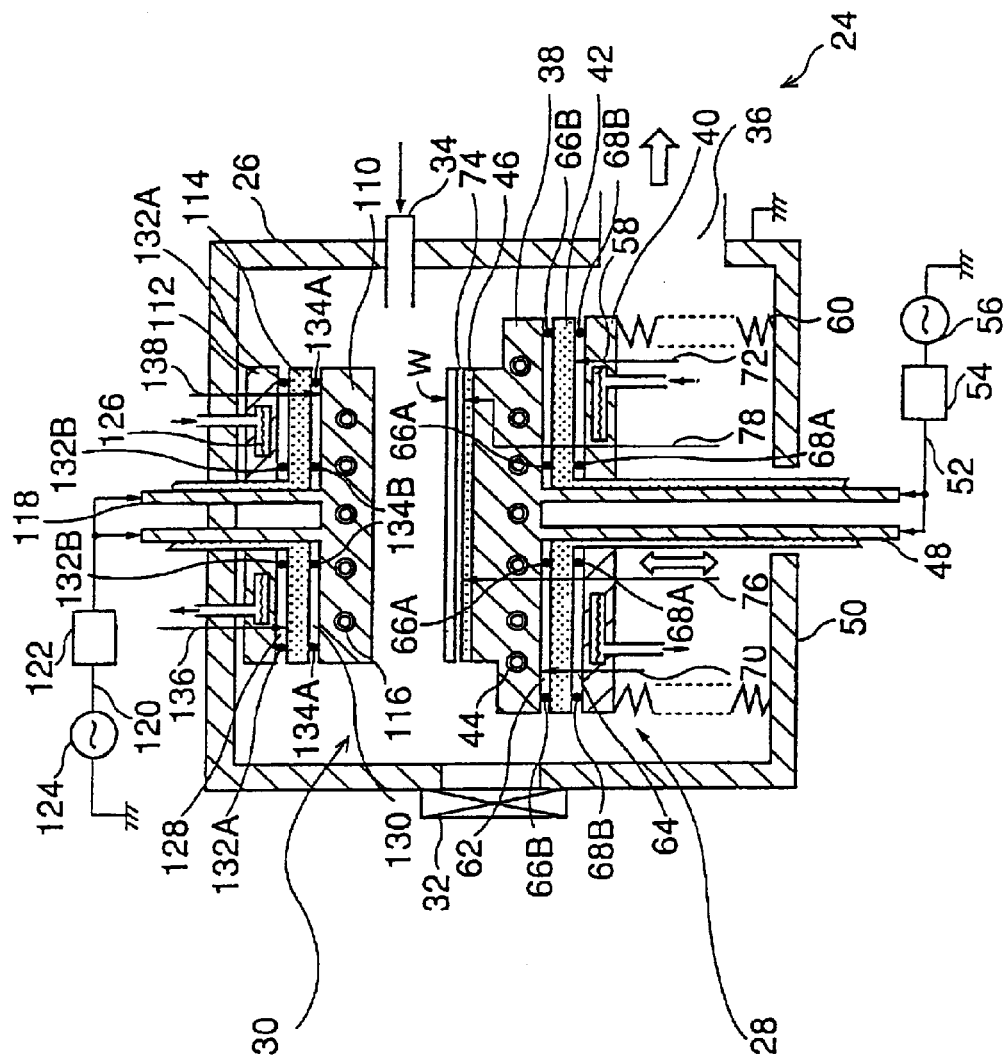
FIG. 2 is a structural view of a plasma processing apparatus according an embodiment of the present invention.
Figure 3A:
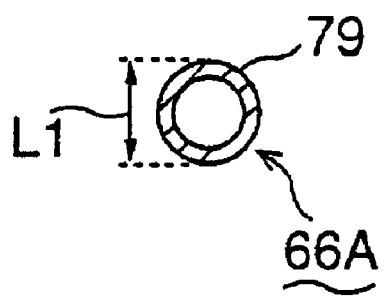
FIGS. 3A though 3E are cross-sectional views of heat resistant metal seal members.
Figure 4:
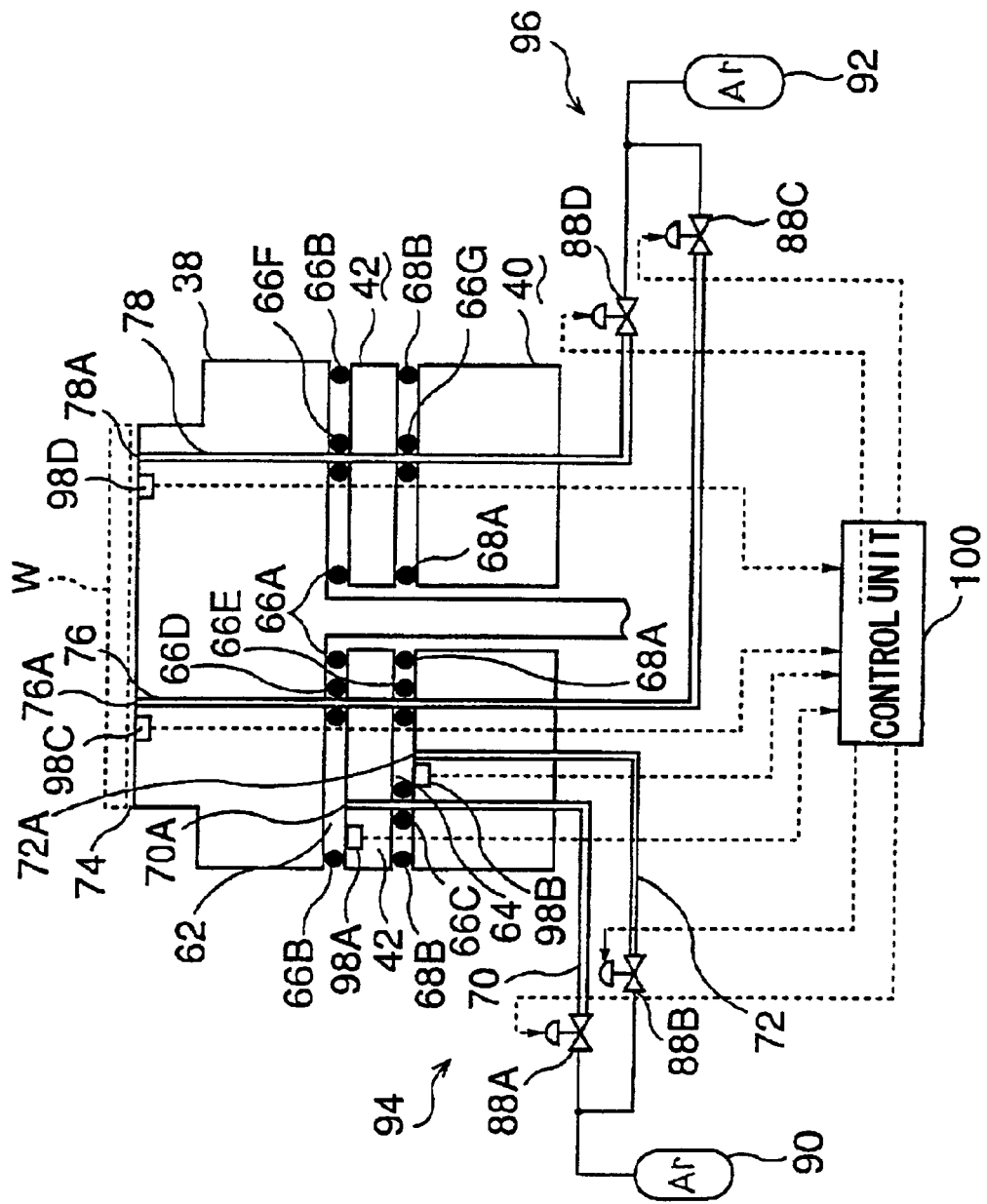
FIG. 4 is a view showing a heat-transfer gas supply system of an embodiment of an electrode structure (lower electrode unit side) according to the present invention.
Figure 5:
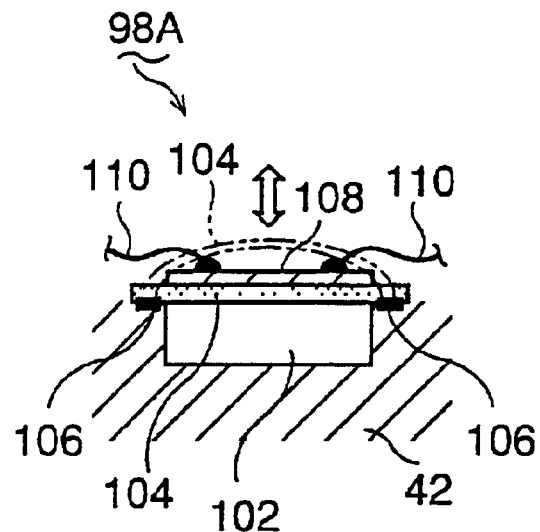
FIG. 5 is a view of a structure of a heat resistant pressure sensor.
Figure 6:
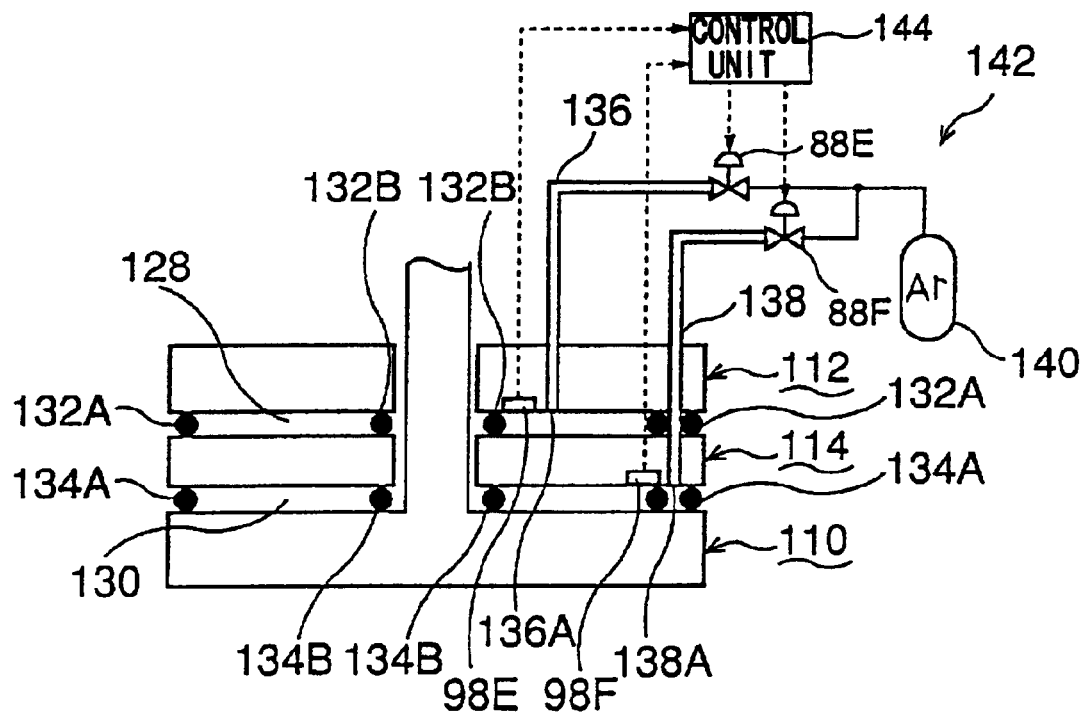
FIG. 6 is an illustration showing a heat transfer gas supply system of an embodiment of an electrode structure (upper electrode unit side) according to the present invention.

FIG. 2 is structural view of a plasma processing apparatus according to an embodiment of the present invention. FIGS. 3A though 3E are cross-sectional views of heat resistant metal seal members. FIG. 4 is a view showing a heat-transfer gas supply system of the embodiment of an electrode structure (lower electrode unit side) according to the present invention. FIG. 5 is an illustrative view of a structure of a heat resistant pressure sensor. FIG. 6 is an illustration showing a heat transfer gas supply system of the embodiment of the electrode structure (upper electrode unit side) according to the present invention.

As shown in the figures, the plasma processing apparatus 24 has, for example, an aluminum made cylindrical process chamber 26. On the bottom side of the process chamber, there is provided a lower electrode structure 28, which also serves as a placement table on which a semiconductor wafer W as an object to be processed is placed. An upper electrode structure 30 is provided on a ceiling part of the process chamber 24.

On the side of the process chamber 26, there are provided a gate valve 32, which is opened and closed when the semiconductor wafer is transported into or out of the process chamber 26, and a gas nozzle for introducing various gases of process gasses such as silane or oxygen. It should be noted that, instead of the gas nozzle 34, a showerhead made of quartz may be provided on a lower surface of the upper electrode structure 30.

On the lower sidewall of the process chamber 26, there is an exhaust port 36 connected to a vacuum exhaust system including a vacuum pump, which is not shown in the figures so that a vacuum can be formed in the process chamber 26.

The above-mentioned lower electrode structure 28 comprises: a lower electrode unit 38 which also serves as a placement table; a cooling block 40 positioned under the lower electrode unit 38; and a lower insulating member 42 which electrically insulates the lower electrode unit 38 and the cooling block 40 from each other by being inserted therebetween. Specifically, the above-mentioned lower electrode unit 38 is made of aluminum.

A sheath heater (heating heater) 44, which is wound in a spiral shape or a concentric shape is embedded inside the lower electrode unit 38 by being cast therein so that the wafer W can be heated. Additionally, a ceramic made electrostatic chuck 46, in which a chuck electrode is embedded, is joined to an upper surface of the lower electrode unit 38 by brazing or the like. The wafer W, which is an object to be processed, is attracted by and held on the electrostatic chuck 46. A column 48, which extends under the lower electrode unit 38, goes through the bottom 50 of the chamber. A matching circuit 54 and a high-frequency source 56 for biasing are connected to the column 48 via lead line 52. A lifting mechanism (not shown in the figures) is mounted to the column so as to move the column 48 up and down.

Similar to the above-mentioned lower electrode unit 38, the cooling block 40 is made of aluminum, and a hollow ring-like cooling jacket 58 is formed in the cooling block 40 so as to flow a coolant therethrough. The wafer W is cooled via the above-mentioned lower electrode unit 38 by flowing a coolant through the cooling jacket 58. Practically, the wafer temperature is controlled to an appropriate value by selectively or simultaneously driving the cooling jacket 58 and the heater unit 44. The lower surface of the cooling block 40 and the bottom 50 of the chamber are joined by an extendible bellows 60 so as to allow an up and down movement with respect to the lower electrode structure 28 while maintaining airtightness of the process chamber 26.

Additionally, a lower insulating member 42 interposed between the lower electrode unit 38 and the cooling block 40 is made of a ring-like quartz glass having a thickness of about 20 mm. The lower insulating member 42 covers a circumference of the column 48 extending from the above-mentioned lower electrode unit 38 so as to insulate also the column 48.

The lower electrode 38 and the lower insulating member 42 are joined in an upside and downside arrangement, and the lower insulating member 42 and the cooling block 42 are also joined in an upside and downside arrangement. An upper electrode-side heat transfer space (upper space) 62 and a lower electrode-side heat transfer space (lower space) 64, each of which is a small gap space, are formed between these members, respectively. The presence of these heat transfer spaces 62 and 64 decreases a heat transfer efficiency in a vertical direction due to both the heat transfer spaces being set to a vacuum state since both the heat transfer spaces 62 and 64 communicate with the process chamber 26. Accordingly, ring-like heat resistant metal seal members 66A, 66B, 68A and 68B are interposed between the heat transfer spaces 62 and 64 in an inner side and an outer side, respectively, so as to maintain the sealing characteristic of both the heat transfer spaces 62 and 64 high. Further, since a slight leakage of the gas cannot be avoided even if the sealing characteristic of both the heat transfer spaces 62 and 64 is maintained high, gas supply passages 70 and 72 are connected to the heat transfer spaces 62 and 64, respectively, so that a pressure controlled heat transfer gas comprising an inert gas such as Ar, He or $N_2$ is supplied thereto.

Additionally, for the same reason as mentioned above, two gas supply passages 76 and 78 are provided to the chuck-side heat transfer space 74 formed between the upper surface of the electrostatic chuck 46 and the back surface of the wafer W so as to increase the efficiency of heat transfer from each of the lower electrode unit 38 and the electrostatic chuck 46 to the wafer W during the plasma processing. In this case, for example, the gas supply passage 76 is used for supplying the gas to the center portion of the electrostatic chuck 46 since the gas diffusion rate in the chuck-side heat transfer space 74 is small, and the gas supply passage 78 is used for supplying the gas to a peripheral portion of the electrostatic chuck 46. It should be noted that the mode of supplying the gas to the chuck-side heat transfer space 74 is not limited to this.

A description will now be given, with reference to FIGS. 3A through 3E, of a structure of each of the heat resistant metal seal members 66A, 66B, 68A and 68B. Since each of the heat resistant metal seal members 66A, 66B. 68A and 68B is the same, the seal member 66A is explained as an example.

The heat resistant metal seal member 66A shown in FIG. 3A is constituted by forming a thin heat resistant metal film 79 in a ring-like shape having a circular cross section, the heat resistant metal film being formed of a metal such as a stainless steel, Inconel (trade name) or Hastelloy (trade name) having a thickness ranging from 0.1 mm to 1.0 mm. The diameter L1 of the cross section is about 3 mm to 4 mm so as to provide an elasticity against a pressing force.

Figure 3B:
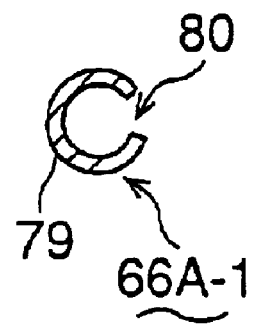

A heat resistant metal seal member 66A-1 shown in FIG. 3B is the heat resistant metal film 79 shown in FIG. 3A provided with a slit 80 on a side surface viewed in the cross section thereof. The slit 80 is formed to extend in a circumferential direction of the ring-like seal member 66A-1 so as to provide elasticity to the seal member 66A-1.

Figure 3C:
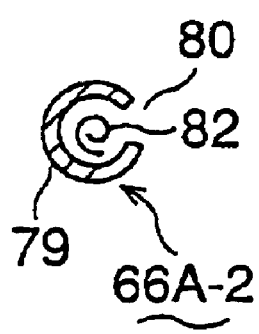

A heat resistant metal seal member 66A-2 shown in FIG. 3C is formed by inserting a coil-like or plate-like spring member 82, which is made of a spring stainless steel or the like, into an inner space of the heat resistant metal film 79 shown in FIG. 3B. The seal characteristic is improved by increasing a spring force by the spring member 82 when being pressed.

Figure 3D:
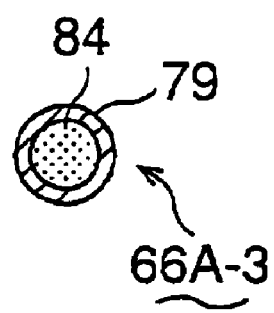

A heat resistant metal seal member 66A-3 shown in FIG. 3D improves traceability of a surface by confining a low melting point material 84 inside the heat resistant metal film 79 having a circular cross section shown in FIG. 3A, the low melting point material melting at a temperature lower than a process temperature. As for the low melting point material 84, indium having a melting point of about 156.4° C. or a solder having a melting point of about 150° C. may be used. In such a case, the metal film 79 is made very thin, such as a thickness ranging from 1.0 μm to 500 μm so as to put an importance to the traceability rather than elasticity.

Figure 3E:
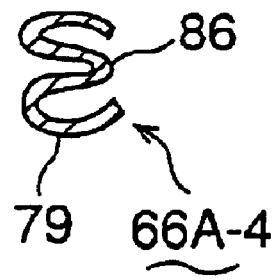

A heat resistant metal seal member 66A-4 shown in FIG. 3E corresponds to the heat resistant metal film 79 having a cross section provided with the slit 80 as shown in FIG. 3B further provided with an inward bet portion so as to improve the seal characteristic by increasing elasticity. As for the heat resistant metal seal members 66A to 68B, any one of the above-mentioned structures may be used.

A description will now be given, with reference to FIG. 4, of the supply system of the heat transfer gas to the electrode-side heat transfer spaces 62 and 64 and the chuck-side heat transfer space 74. As shown in FIG. 4, each of the gas supply passages 70, 72, 76 and 78 connected to the respective electrode-side heat transfer spaces 62 and 64 and the chuck-side heat transfer space 74 is provided with respective one of the flow control devices 88A to 88D such as mass flow controllers. Each of the gas supply passages 70, 72, 76 and 78 is connected to N$_2$ gas sources 90 and 92 which are sources of the heat transfer gas, which constitute the electrode-side heat transfer gas supply means 94 and the chuck-side heat transfer gas supply means 96. It should be noted that the N$_2$ gas sources 90 and 92 may be a common gas source.

Each of the flow control devices 88A to 88D is controlled by the a control unit 100 based on a detection value of heat resistant pressure sensors 98 to 98D provided to the respective heat transfer spaces 62, 64 and 74. Specifically, the above-mentioned heat resistant pressure sensors 98A to 98D are provided in the vicinity of the respective gas outlet ports 70A, 72A, 76A and 78A of the gas supply passages 70, 72, 76 and 78 so as to detect a pressure in the respective spaces. It should be noted that 66C to 66G in FIG. 4 are heat resistant metal seal member having a structure the same as the above-mentioned structures that seal each of the gas supply passages. Each of the above-mentioned heat resistant pressure sensors 98A to 98D has the same structure, and a description will be given, with reference to FIG. 5, of a structure of the sensor 98A as an example.

As shown in FIG. 5, a concave portion 102 is formed on the surface of the lower insulating member 42 as a base for mounting the heat resistant pressure sensor 98A. The opening of the concave portion 102 is covered by a base plate 104 which is made of a bendable ceramic plate or a metal plate, and the base plate 104 is airtightly bonded by a brazing material 106 or the like. At this time, the inside of the concave portion 102 is set to a predetermined pressure (for example, about an atmospheric pressure). A resistance pattern 108, which is made of an alloy comprising nickel and chrome, is formed on the surface of the base plate 104 in an insulated state with respect to the base plate 104 (when the base is made of a metal), and the resistance pattern 108 is expandable so as to generate a change in the resistance by tracing a bending deformation of the base plate 104 (indicated by single dashed chain lines in the figure). The small change in the resistance is electrically detected by the control unit 100 via a lead wire 110. The small change in the resistance may be detected by using, for example, a Wheatstone bridge circuit. It should be noted that, in this case, the control unit is provided with a temperature compensation circuit (not show in the figure) so as to cancel the change in the resistance of the resistance pattern 108 which is generated in association with a temperature change. Additionally, The structure of the heat resistant pressure sensor 98A is not limited to the above-mentioned structure if the heat resistant pressure sensor can withstand the process temperature of the apparatus according to the present invention.

Returning to FIG. 2, a description will be given of the upper electrode structure 30. A basic structure of the upper electrode structure 30 is the same as that of the lower electrode structure 28. That is, the upper electrode structure 30 comprises: an upper electrode unit 110; a cooling block 112 positioned above the upper electrode unit 110; and an upper insulating member 114 which electrically insulates the upper electrode unit 110 and the cooling block 112 from each other by being inserted therebetween. Specifically, the above-mentioned upper electrode unit 110 is made of aluminum.

A heater unit 116, which is wound in a spiral shape or a concentric shape similar to the heater unit 44 in the above-mentioned lower electrode unit 38, is embedded inside the upper electrode unit 110. A column 118, which extends above the upper electrode unit 114, goes through the ceiling of the chamber. A matching circuit 112 and a high-frequency source 124 for biasing are connected to the column 118 via lead line 120 so as to generate a plasma in the process space.

Similar to the lower electrode unit 38, the cooling block 112 is made of aluminum. A hollow ring-like cooling jacket 126 is formed in the cooling block 112 so as to flow a coolant therethrough. The above-mentioned cooling jacket 110 is maintained at a constant temperature, for example, a temperature the same as the temperature of the lower electrode unit 38 by flowing the coolant through the cooling jacket 126. Practically, the temperature of the upper electrode unit is controlled to an appropriate value by selectively or simultaneously driving the cooling jacket 126 and the heater unit 116. The reason for the temperature control of the upper electrode unit 110 is that if the temperature of the electrode is increased to a temperature higher than the wafer W or the lower electrode unit 38, a heat radiation is generated therebetween which may cause a heat fluctuation.

Additionally, a upper insulating member 114 interposed between the upper electrode unit 110 and the cooling block 112 is made of a ring-like quartz glass having a thickness of about 20 mm. The upper insulating member 114 covers a circumference of the column 118 extending from the above-mentioned upper electrode unit 110 so as to insulate also the column 118.

The upper electrode unit 110 and the upper insulating member 114 are joined in an upside and downside arrangement, and the upper insulating member 114 and the cooling block 112 are also joined in an upside and downside arrangement. An upper electrode-side heat transfer space (upper space) 128 and a lower electrode-side heat transfer space (lower space) 130, each of which is a small gap space, are formed between these members, respectively. Accordingly, similar to the case of the lower electrode structure 28, ring-like heat resistant metal seal members 132A, 132B, 134A and 134B are interposed between the heat transfer spaces 128 and 130 in an inner side and an outer side, respectively, so as to maintain the sealing characteristic of both the heat transfer spaces 128 and 130 high. Further, gas supply passages 136 and 138 are connected to the heat transfer spaces 128 and 130, respectively, so that a pressure controlled heat transfer gas comprising an inert gas such as Ar, He or $N_2$ is supplied thereto. That is, as shown in FIG. 6, the gas supply passages 136 and 138 connected to the respective electrode-side heat transfer spaces 128 and 130 are provided with follow control devices 88E and 88F such s mass flow controllers, respectively, so as to constitute electrode-side heat transfer gas supply means 142.

The flow control devices 88B and 88F are controlled by a control unit 144 based on the detection value of the heat resistant pressure sensors 98E and 98F an provided to the respective heat transfer spaces 128 and 130. It should be noted that the above-mentioned control unit 100 may also serves as the control unit 144. Specifically, the above-mentioned heat resistant pressure sensors 98E and 98F are provided in the vicinity of the gas outlet ports 136A and 138A of the gas supply passages 136 and 138 so as to detect the pressure in the respective spaces. The structure of each of the sensors 98E and 98F is the same as that described with reference to FIG. 5.

A description will now be given of an operation of the thus-structured plasma processing apparatus.

First, the semiconductor wafer W is transported into the process chamber 26 through the opened gate valve 32 in a state in which the lower electrode structure 28 is moved down to a predetermined position for transportation. Then, the wafer W is placed on the top surface of the preheated lower electrode unit 38, which serves as a placement table so as to attract and hold the wafer W by the electrostatic chuck 46. The lower electrode unit 38 and the upper electrode unit 110 are preheated at a temperature ranging from 350° C. to 500° C. so as to improve the throughput.

Then, in this state, the lower electrode structure 28 is lifted to a predetermined process position. At the same time, the temperature of the wafer is raised to the process temperature of, for example, about 500° C. by increasing a power supplied to the heater unit 44 of the lower electrode unit 38 and the heater unit 116 of the upper electrode unit 110. It should be noted that when the wafer is previously heated to the process temperature, there is no need to raise the temperature. Then, a predetermined film deposition gas such as $SiH_4$, $SiF_4$ or $O_2$ is supplied to the process space. Then, the pressure inside the process chamber 26 is maintained at a predetermined process pressure by driving the vacuum pump (not shown in the figure) to evacuate the gas inside the process chamber 26 through the exhaust port 36.

Then, a high-frequency plasma voltage having a frequency of, for example, 13.65 MHz is applied to the upper electrode unit 110 by the plasma generation high-frequency power source 124 so as to generate a plasma. At the same time, a high-frequency voltage for biasing is applied to the lower electrode unit 38 by the bias high-frequency power source 56. Thereby, a plasma is generated in the process space, and the deposition gas is activated which results in deposition of a predetermined film such as SiOF on the surface of the wafer W.

After the plasma process is started, the wafer W and the upper electrode 110 are gradually heated. In order to prevent the wafer W form overheating, the coolant is supplied to the cooling jackets 58 and 126 provided to the cooling blocks 40 and 112 so as to appropriately control the cooling Jackets 58 and 126 and the heater units 44 and 116 so that the temperature of the wafer W is controlled to be maintained at the process temperature. It should be noted that water or Gurden (trade name) may be used as the coolant for the cooling jackets 58 and 126.

In such a condition, Ar gas as the heat transfer gas is supplied by the gas supply means corresponding to the above-mentioned heat transfer spaces 62, 64, 74, 128 and 130 so as to maintain the temperature controllability of the wafer W so that the heat transfer spaces can be maintained at a constant pressure ranging from, for example, from 10 to 20 Torr.

Since the heat resistant metal seal members 66A, 66B, 68A, 68B, 132A and 132B having structures shown in FIGS. 3A to 3E are used so as to seal the heat transfer spaces, the seal characteristic can be maintained high even if the process temperature is raised to about 500° C. and the heat transfer gas can be prevented from leaking to the process chamber. Accordingly, the temperature control of the wafer W can be accurately performed while maintaining the high heat transfer efficiency without consuming a large amount of heat transfer gas.

Additionally, the heat transfer spaces 62, 64, 74, 128 and 130 are provided with the respective heat resistant pressure sensors 98A through 98F having the structure as shown in FIG. 5 which can withstand a temperature as high as about 500° C. The heat resistant pressure sensors 98A through 98F detects a pressure of the heat transfer spaces, and the flow of the heat transfer gas is controlled so as to maintain the detected pressure at a constant value, thereby enabling an accurate control of the gas pressure. Especially, since the pressure in each of the heat transfer spaces, which are objects to be subjected to the pressure control, can be directly detected by each sensor, more accurate pressure control having a quick response can be performed unlike the conventional method in which the pressure control is performed by detecting the gas pressure in the gas supply system.

Particularly, in a case in which a positional offset is generated in the wafer W on the surface of the electrostatic chuck 46 or the wafer W is not places at an appropriate position due to foreign materials existing therebetween, the pressure in the chuck-side heat transfer space 74 is not increased to a predetermined value when the heat transfer gas is supplied thereto. However, the above-mentioned sensor 98C (or 98D) having a quick response can immediately detect the insufficient pressure rise so as to determine the defective placement of the wafer W.

Additionally, by providing the lower insulating member 42 or the upper insulating member 114, the high-frequency current voltage via the coolant is prevented from leaking to outside (circulating device of the coolant) in a case in which a coolant (for example, water) having an insulating characteristic which is not so high is used as the coolant flowing through the cooling jackets 58 and 126, thereby enabling efficient use of the high-frequency voltage for generation of a plasma.

A description will now be given, with reference to FIGS. 7 and 8, of a material of the lower insulating member 42 and the upper insulating member 114.

Figure 7:
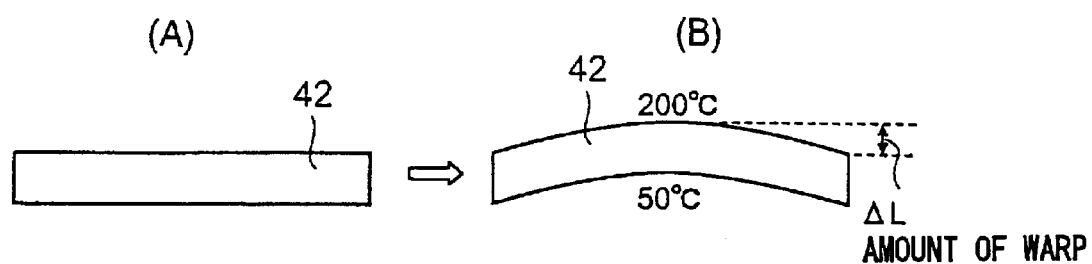
FIG. 7 is an illustration for explaining a warp caused by a temperature difference of an insulating member.
Figure 8:
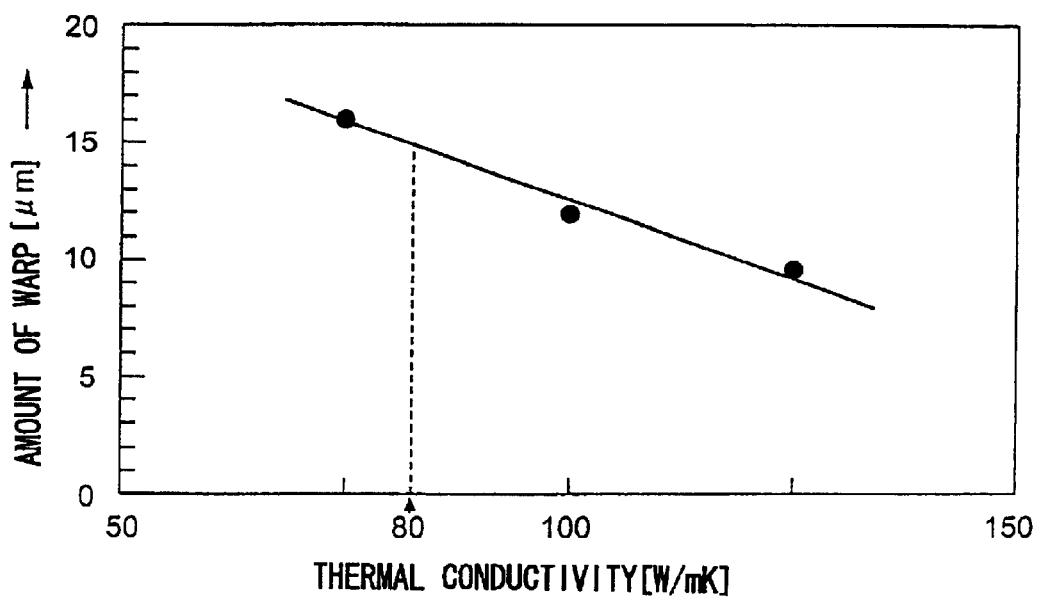
FIG. 8 is a graph showing a relationship between the coefficient of thermal conductivity and an amount of warp.
Figures 9A, 9B, 9C, 9D:
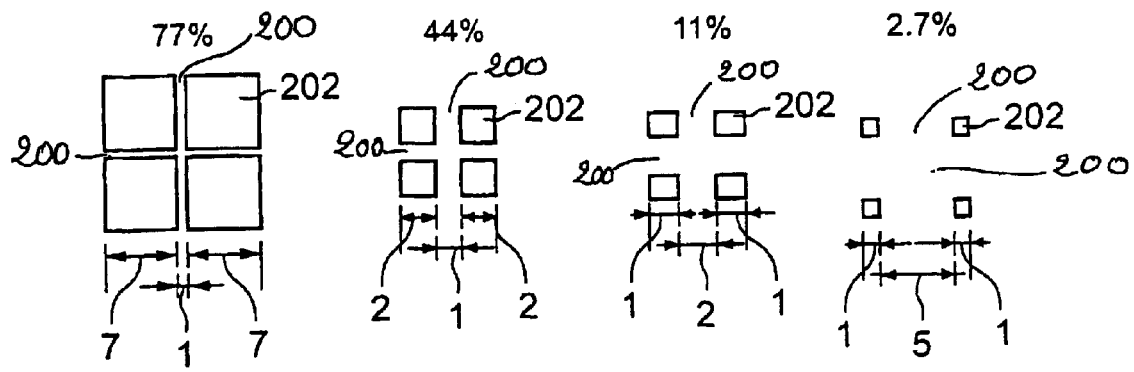
FIGS. 9A through 9D are views for explaining a rate of contact when gas grooves having various widths are provided on a contact surface of a member.

FIG. 7 is an illustration for explaining a state in which the insulating member is warped, and FIG. 8 is a graph showing the relationship between thermal conductivity and an amount of warp of the insulating member.

In the embodiment shown in FIG. 2, merely quartz glass is used for the insulating members 42 and 114. Since the quartz glass has a low coefficient of thermal conductivity, there is a large difference in temperature between the upper surface and the lower surface when the upper surface of the lower insulating member 42, for example, is put into contact with the lower electrode unit 38 having a high temperature and the lower surface of the insulating member 42 is put into contact with the cooling block 40. As a result, when there is no temperature difference, the lower insulating member 42 is flat as shown in FIG. 7-(A). However, as shown in FIG. 7-(B), if a temperature difference of about 150° C. is generated such as in a case in which the upper surface is at 200° C. and the lower surface is 500° C., the lower insulating member 42 in this case is bent downwardly and warp is generated due to the difference in the thermal expansion between the upper surface and the lower surface of the lower insulating member 42. An amount of warp at this time is determined by the coefficient of thermal conductivity, the coefficient of thermal expansion and the size and shape of the material forming the lower insulating member 42. If such an amount of warp is large, the upper and lower surfaces do not evenly contact the upper electrode unit 38 and the cooling block 40, which results in uneven contact. As a result, a heat cannot be evenly released from the surface of the lower electrode unit 38 and there is unevenness generated in the temperature of the wafer, and the uniformity of the temperature in the surface of the wafer tends to deteriorate.

Accordingly, in the present embodiment, a material having a good thermal conductivity is used for the lower insulating member 42. That is, when the allowable amount $\Delta L$ of warp in the present embodiment is set to, for example, 15 μm, a material having a coefficient of thermal conductivity of more than 80 W/mK (meter-Kelvin) is used. As for such a material, any material having the coefficient of thermal conductivity of more than 80 W/mK can be used. For example, aluminum nitride (AlN), which is a ceramic material can be used.

FIG. 8 is a graph showing a relationship between the coefficient of thermal conductivity and an amount of warp of the insulating member. It can be appreciated from the graph of FIG. 8 that the amount of warp is less than 15 μm, which is an allowable amount, when the coefficient of thermal conductivity is greater than 80 W/Km. The conditions of the experiments were such that the diameter of the insulating member was 230 mm, the thickness was 12 mm and the heat input from the upper surface was 1500 W. Additionally, regarding the characteristic of the insulating member, the Young's modulus was 300 GPa, the Poisson ratio was 0.33 and the coefficient of thermal expansion was $5.0 \times 10^{-6} K^{-1}$.

As mentioned above, the temperature difference between the upper and lower surfaces is reduced by forming the insulating material by a material having a high coefficient of thermal conductivity, which results in reduction in the amount of deformation due to warp. As a result, the insulating member 42 does not locally contact with the members located upside and downside thereof and the uniformity of the temperature in the surface of the wafer W can be maintained.

Since the above-mentioned phenomenon occurs not only in the lower insulating member 42 but also in the upper insulating member 114 (the direction of warp is opposite to the above-mentioned direction), it is preferable that the upper insulating member 114 also be made of aluminum nitride having a coefficient of thermal conductivity of greater than 80 W/mK.

A description will now be given, with reference to FIGS. 9A through 9D and FIG. 10, of a surface structure of the lower insulating member 42 and the upper insulating member 114.

In FIG. 2. FIG. 4 and FIG. 6, the width of each of the heat transfer spaces 62, 64, 128, and 130 is indicated larger than the actual width in order to facilitate a better understanding. Actually, each of the seal members is situated within a concave groove. Additionally, although the structure is fixed by being tightened in a direction of height and an air gap corresponding to each of the heat transfer spaces is rarely formed, the joint surfaces of the members defining each of the heat transfer spaces are in a point contacting state in which the joint surfaces contact to each other at irregularly arranged many contact points when microscopically viewed. Thereby, the heat transfer gas flows in the air gap along irregular paths. Thus, the heat transfer efficiency differs from position to position along the vertical direction, and, thereby the uniformity of the wafer temperature in the surface tends to deteriorate.

In the present embodiment, the joint surfaces that are joined in the vertical relationship to define each of the heat transfer spaces 62, 64, 128 and 130 are provided with gas grooves, through which the heat transfer gas flows, substantially uniformly in the surfaces. The contact rate of joint surfaces is set to, for example, 40% to 80%. That is, for example, mesh-like or cross-stripe gas grooves 200 (refer to FIGS. 9A through 9D) having a predetermined width are formed by carving one or both of the upper and lower surfaces of the lower insulating member 42 over the entire surface. Accordingly, the heat transfer gas flows through the gas grooves 200, and, thereby, the heat transfer gas can reach evenly over the entire surface of the insulating member 42. As a result, the heat transfer efficiency in the vertical direction over the entire surface of the insulating member becomes uniform, and the uniformity of the temperature distribution in the wafer can be improved. In this case, if the contact rate is reduced in excess, the heat resistance in the vertical direction becomes excessively large and the controllability of the temperature of the wafer is deteriorated. Thus, the lower limit of the contact rate is about 40% as mentioned above.

Figure 10:
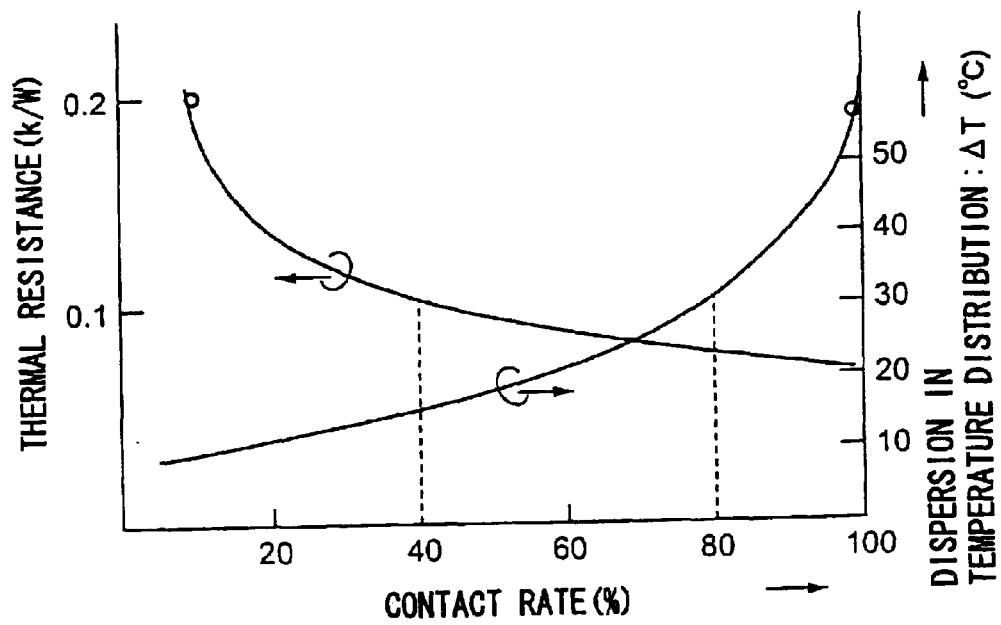
FIG. 10 is a graph showing a relation ship between a contact rate and each of a thermal resistance and the dispersion in a temperature distribution.

The optimum contact rate was obtained by experiments and a description will now be given, with reference to FIGS. 9A through 9D and FIG. 10, of the results of the experiments. FIGS. 9A through 9D are illustrations indicating various contact rates when the gas grooves having various widths are provided to the joint surface of the member. FIG. 10 is a graph showing a relationship between the contact rate and each of the heat resistance and the dispersion in the temperature distribution. The contact rate represents a ratio of the area of the gas grooves to the area of the rest of the surface when the gas grooves are formed on the surface of the insulating member. In FIGS. 9A through 9D, parts of the surface of the insulating member 42, on which the gas grooves 200 are formed, are shown, and square parts 202 corresponds to the contact surface. When the ratio of a side of one of the contact parts 202 to the width of one of the gas grooves 200 is 7:1, the contact rate is 77% (refer to FIG. 9A). When the above-mentioned ratio is 2:1, the contact rate is 44% (refer to FIG. 9B). Additionally, when the above-mentioned ratio is 1:2, the contact rate is 11% (refer to FIG. 9C). Further, when the above-mentioned ratio is 2:5, the contact rate is 2.7% (refer to FIG. 9D). It should be noted that when no contact groove is formed, the contact rate is 100%.

The results of investigation regarding the heat resistance and the dispersion ΔT of the temperature distribution in the wafer surface or various contact rates are shown in FIG. 10. It should be noted that the dispersion in the temperature distribution is represented by a difference between the maximum value and minimum value of the temperature of the wafer surface.

Although it depends on a kind of process, the dispersion in the temperature distribution in a general heating process is required to be less than 30° C. Additionally, if the heat resistance is excessively large, release of heat (cooling) cannot be smoothly performed. Thus, the response slows down even if the power of the heater or the flow of the coolant in the cooling block is controlled, and the temperature controllability of the wafer is deteriorated. Thus, the upper limit is about 0.1 K/W. Accordingly, in order to satisfy the both, it was found that the contact rate should be set within a range from 40% to 80%.

As mentioned above, according to the present embodiment, since the heat transfer gas can flow uniformly in any direction within the surface without excessively increasing the heat resistance, the uniformity of the temperature distribution in the wafer surface can be further improved.

It can be realized that the above-mentioned gas grooves 200 are applicable not only to the upper and lower surfaces of the lower insulating member 42 and the upper and lower surfaces of the upper insulating member 114 but also to the surface of the electrode unit contacting the aforementioned surfaces and the surface of the cooling block.

Figure 11:
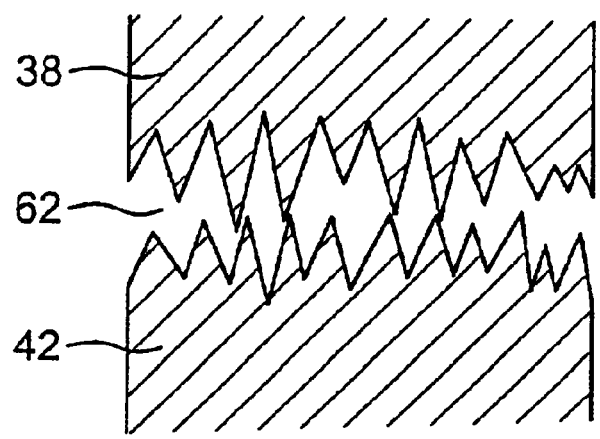
FIG. 11 is an illustration of a heat transfer space formed between the lower surface of a lower electrode unit and the upper surface of an upper electrode unit.
Figure 12:
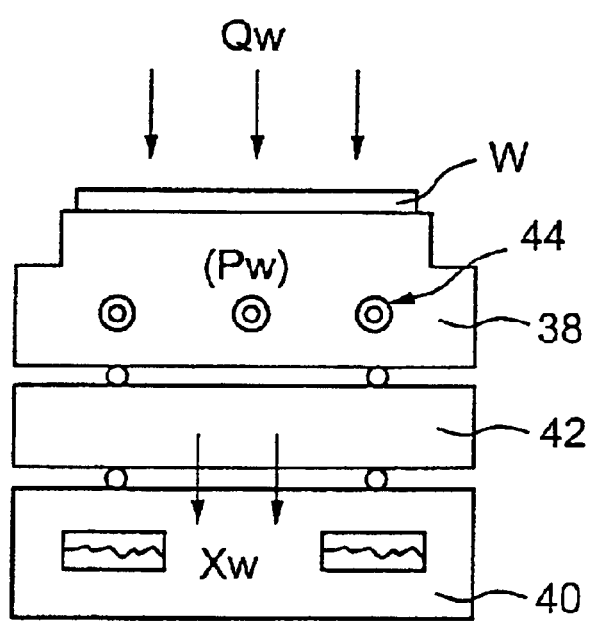
FIG. 12 is an illustration of the electrode structure shown in FIG. 2.
Figure 13:
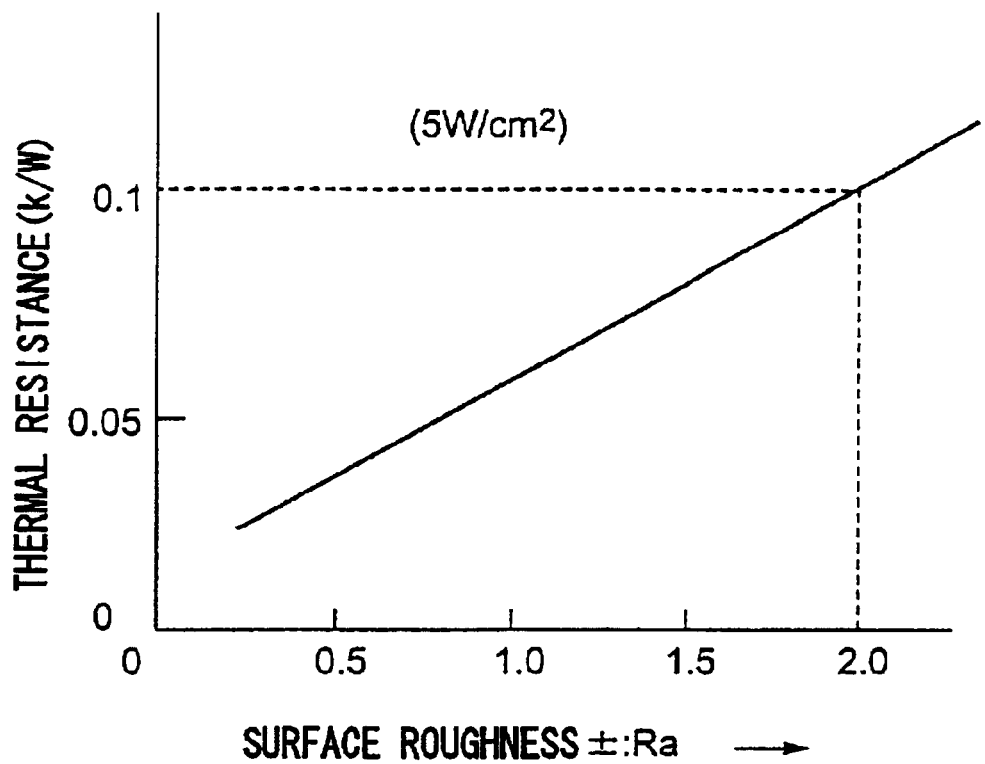
FIG. 13 is a graph showing a relationship between the surface roughness Ra of the insulating member and a thermal resistance.

A description will now be given, with reference to FIGS. 11 through 13, of an example in which the surface roughness Ra of the lower insulating member 42 and the upper insulating member 114 is defined.

Since the surface roughness of each member defining each of the heat transfer spaces 62, 64, 128 and 130 shown in FIG. 2 provides an influence to the actual contact area between the members and the actual distance between the members, the heat transfer efficiency, that is, the heat resistance between the opposed members is influenced. FIG. 11 is a microscopically enlarged illustration of a part of the heat transfer space 62 formed between the lower surface of the lower electrode unit 38 and the upper surface of the lower insulating member 42 as an example. As shown in FIG. 11, it can be appreciated that the actual contact area between the members and the actual distance between the members are changed depending on the surface roughness.

If the heat transfer space 62, which is formed between the lower surface of the lower electrode unit 38 and the upper surface of the lower insulating member 42, is large, the heat resistance between the lower surface of the lower electrode unit 38 and the upper surface of the lower insulating member 42 is larger. If the heat resistance is large, the release of heat (cooling) cannot be smoothly performed, and the controllability of the wafer temperature may be deteriorated.

This will be described with reference to FIG. 12. FIG. 12 is an illustrative view of the electrode unit 28 shown in FIG. 2. In FIG. 12, it is assumed that an amount of heat Qw is supplied to the wafer W due to the plasma, and a maximum amount of heat Pw can be supplied by the heater unit 44. Also it is assumed that a heat release (cooling) of an amount of heat Xw is performed in the cooling block 40. If the heat resistance at the upper and lower boundaries of the insulating member 42 is large, the amount of heat Xw cannot be large and a large amount of heat is accumulated in the electrode unit 38. Accordingly, the output power of the heater unit 44 must be controlled, and, therefore, the temperature controllability for maintaining the wafer W at an appropriate process temperature is deteriorated.

Accordingly, in the present embodiment, the surface roughness Ra of the upper and lower boundaries of the insulating member 42 is set smaller than 2.0 μm so as to set the heat resistance to be smaller than 0.1 K/W. As mentioned above, if the heat resistance is smaller than 0.1 k/W, the amount of heat Xw for heat release can be increased. Accordingly, an increased power can be supplied to the heater unit 44, and, thus, the wafer temperature can be controlled with a good controllability.

A description will now be given, with reference to FIG. 13, of the upper limit value of each of the heat resistance and the surface roughness. FIG. 13 is a graph showing the surface roughness Ra of the insulating member and the heat resistance. Apparent from the graph, the heat resistance is increased as the surface roughness Ra is increased. In the conventional electrode structure, the amount of heat to be released must be at least 5 W (watts)/$cm^2$ in consideration of the power of the heater unit 44 and the amount of cooling of the cooling block 40. The heat resistance at this time is about 0.1 K/W. Accordingly, it can be appreciated from the graph that the surface roughness Ra should be set to be smaller than 2.0 μm.

It can be realized that the surface roughness Ra of the above-mentioned insulating member 42 is applicable, in the similar manner, to the upper insulating member 114 of the upper electrode structure 30 (refer to FIG. 2).

Figure 14:
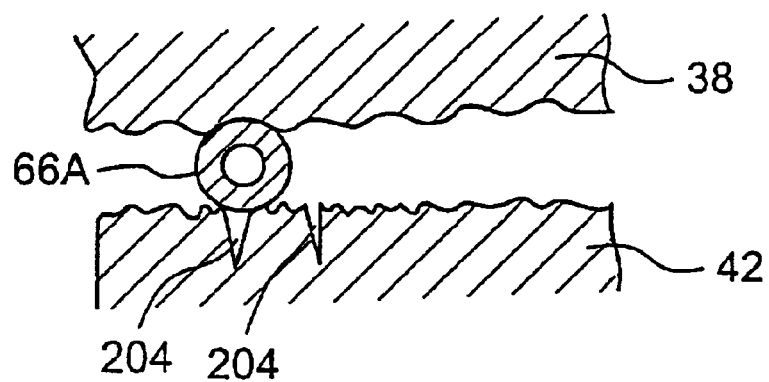
FIG. 14 is an illustration of the lower surface of a mirror finished electrode unit and the upper surface of the insulating member.

A description will now be given, with reference to FIG. 14 through FIG. 16, of a variation of the heat resistant metal seal member to improve the seal characteristic.

Generally, the surfaces of the insulating member the electrode unit and the cooling block are in a flat, smoothed state by being mirror finished by lapping or the like so as to achieve a good contact therebetween. FIG. 14 illustratively shows the lower surfaces of the electrode unit and the upper surface of the insulating member, which surfaces are mirror finished and irregularity of the surface is vary small. However, there is a case in which a small scratch 204 is formed in the surface of the insulating member 42, which is made of quartz glass of a ceramic material, due to grain loss during the mirror finishing process. The scratch 204 may also be generated on the side of the electrode unit 38, which is made of aluminum.

If such a scratch 204 due to grain loss is generated, there is a case in which the scratch may act as a leak path and the heat transfer gas may leak through the scratch even if the heat resistant metal seal member 66A is provided.

Accordingly, in the present embodiment, a soft metal film or soft metal layer, which is made of a low melting point material that softens near the process temperature of the wafer, is formed on the surface of the heat resistance metal seal member or the surface of the member contacting the heat resistant metal seal member.

Figure 15A:
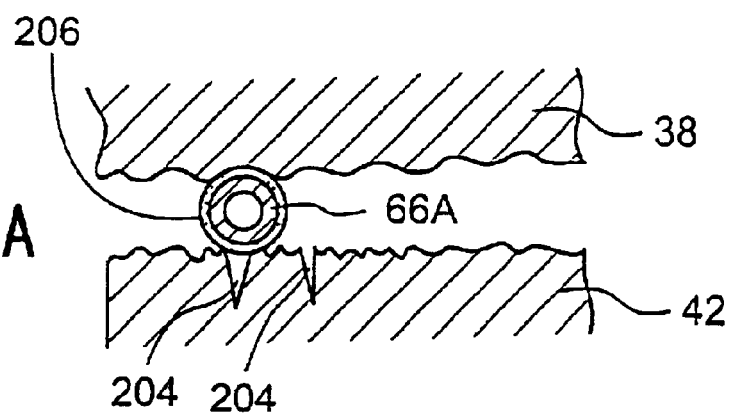
FIG. 15A is a view showing a state in which a soft metal film is formed on the surface of the heat resistant metal seal member.
Figure 15B:
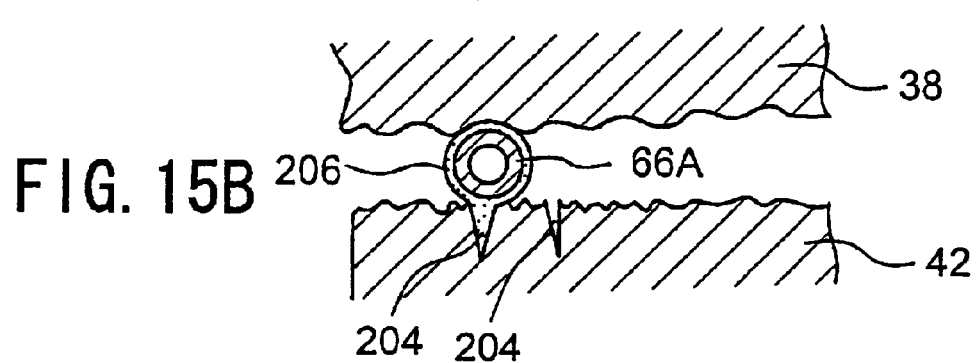
FIG. 15B is a view showing a state in which the soft metal film is softened in the state shown in FIG. 15A.
Figure 16A:
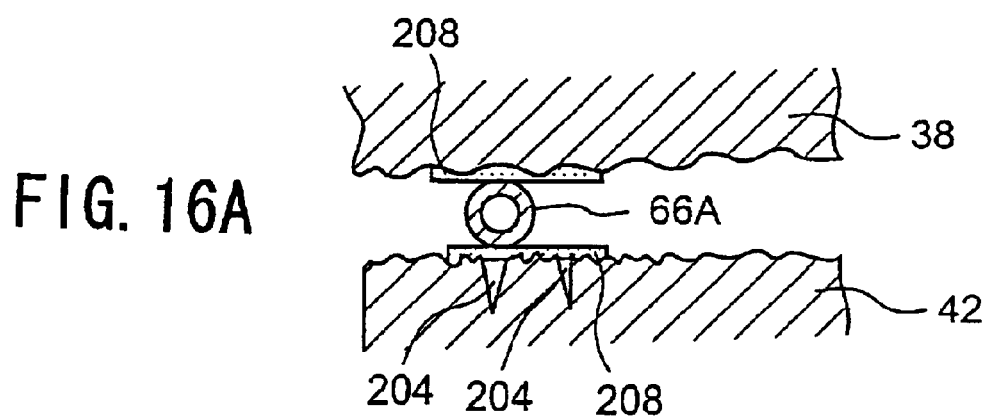
FIG. 16A is a view showing a state in which a soft metal film is formed on the surface of the member contacting the heat resistant metal seal member.
Figure 16B:
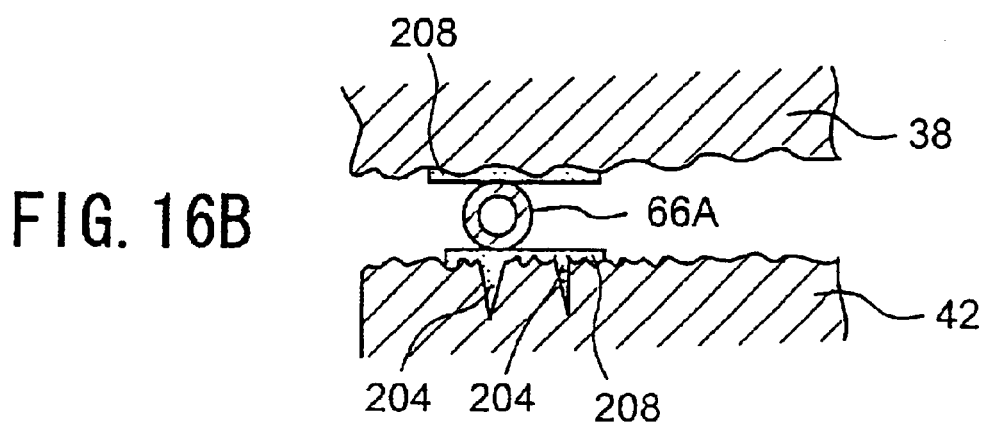
FIG. 16B is a view showing a state in which the soft metal film is softened in the state shown in FIG. 16A.

FIG. 15A shows a state in which the soft metal film 206 is formed on the surface of the heat resistant metal seal member 66A, and FIG. 15B shows a state in which the soft metal film 206 is softened. Additionally, FIG. 16A shows a state in which the soft metal layer 208 is formed on the surface of the member contacting the heat resistant metal seal member 66A, that is, the lower surface of the electrode unit 38 and the surface of the insulating member 42, and FIG. 16B shows a state in which the soft metal layer 208 is softened. The soft metal layer 208 is formed in a ring-like shape along the seal member 66A. The soft metal film 206 and the soft metal layer 208 may be made of indium as explained with reference to FIG. 3D, but not limited thereto.

As mentioned above, when the soft metal film 206 or the soft metal layer 208 is used, the material is softened during the process of the wafer and the softened material enters the above-mentioned scratch 204 so as to fill the scratch (refer to FIG. 15(B) and 16(B)). Accordingly, there is no leak path, and the heat transfer gas can be prevented from leaking outside.

Although the soft metal layer 208 is provided to both surfaces to which the seal member 66A contacts as shown in FIG. 16A, the soft metal member 208 may be provided only to the insulating member 42 in which a frequency of generation of the scratch 204 is high. Additionally, the combination of the structure shown in FIG. 15A and the structure shown in FIG. 16A may be used.

A description will now be given, with reference to FIG. 17A and 17B, of variations of the heat resistant metal seal member to improve a corrosion resistance with respect to a fluoride gas.

In this kind of processing apparatus, there is a case in which a highly corrosive fluoride gas is used in a process, an etching process or a cleaning process. In such a case, the fluoride gas may cause corrosion of the heat resistant metal seal member when the fluoride gas is bring into contact with the heat resistant metal seal member.

Figure 17A:
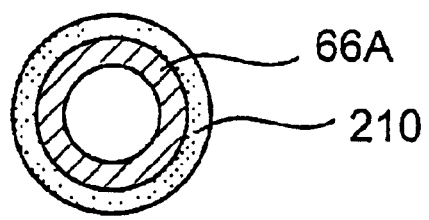
FIGS. 17A and 17B are views showing a state in which a fluoride passivation film is formed on the surface of the heat resistant metal seal member.
Figure 17B:
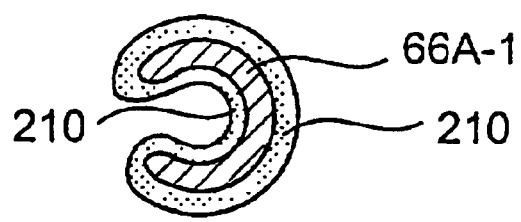

However, in the present embodiment, in order to prevent the corrosion, as shown in FIG. 17A and 17B, a fluoride passivation film 210 is formed on the surface of the heat resistant metal seal member, which passivation film has a high corrosion resistance with respect to the fluoride gas. In the heat resistant metal seal member shown in FIG. 17A, the fluoride passivation film 210 is formed on the entire surface of the heat resistant metal seal member 66A (the same as that shown in FIG. 3A) having a circular cross section. Additionally, the heat resistant metal seal member shown in FIG. 17B is the heat resistant metal seal member 66A-1 (the same as that shown in FIG. 3B) having an arc-like shape of which part is open, and the fluoride passivation film 210 is formed on the entire front and back surfaces, that is, the entire exposed surfaces which can be brought into contact with the fluoride gas. Also in the cases of the seal members 66A-2, 66A-3 and 66A-4, the fluoride passivation film 210 may be formed on not only an outer surface but also an inner surface.

Thereby, the meal seal member 66A is prevented from being corroded by the fluoride gas, which improves the corrosion resistance of the member. It should be noted that the method of forming the fluoride passivation film 210 can be applied to other all metal seal members 66B, 132A and 132B (refer to FIG. 2).

A description will now be given, with reference to FIG. 18 through FIG. 20, of a variation, which improves the uniformity of the temperature in the wafer surface by adapting a part of the column 48 supporting the electrode unit 38.

The column 48 having a diameter of 4 cm to 5 cm and supporting the lower electrode unit 38 has a hollow interior as shown in FIG. 2, and the interior may be open to atmosphere or the column may be sealed. In any case, the center portion of the lower electrode unit 38 to which the column 48 is connected has less heat release effect since the cooling block 40 is not positioned underneath. Accordingly, the temperature of the center portion of the lower electrode unit 38 tends to be slightly higher than the temperature of the periphery, which is a cause of deterioration of the uniformity of the temperature in the wafer surface.

Accordingly, in the present embodiment, gas blower means is provided so as to promote a release of heat at this portion. FIG. 18 is a view showing a state in which the gas blower is provided inside the column. FIG. 19 is a graph showing the temperature distribution in the surface of the semiconductor wafer.

Figure 18:
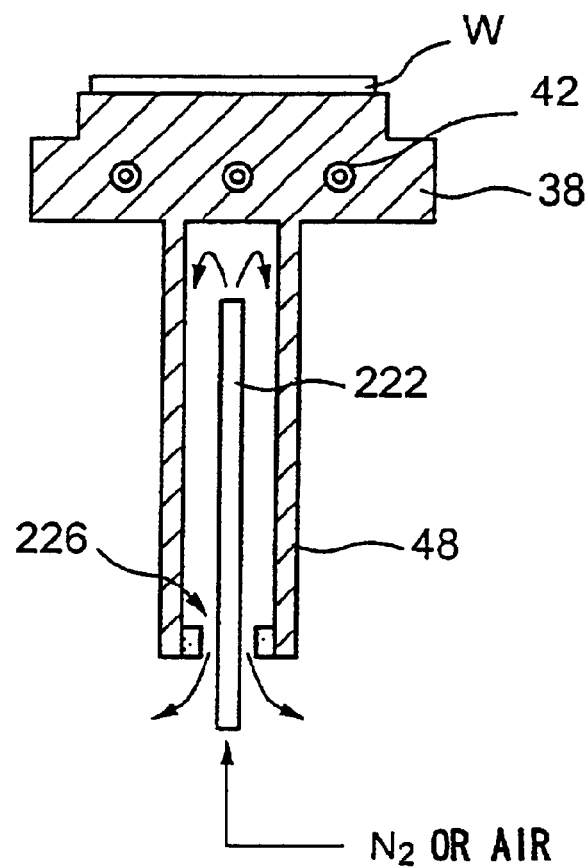
FIG. 18 is a view showing a state in which a gas blower means is provided to a support column.

As shown in FIG. 18, a gas injection nozzle 222 as the gas blower means 220 is inserted into the hollow column 48 from underneath, which column supports the center portion of the lower electrode unit 38. An injection port 224 at the end of the gas injection nozzle 222 is located at a position under the lower surface of the electrode 38 by about 1 cm apart from the lower surface of the electrode unit 38 so that a gas such as $N_2$ gas or air at a room temperature is injected toward the center portion of the lower surface of the electrode unit 38 so as to promote the release of heat (cooling) at this portion. The injected gas is exhausted through an exhaust port 226 at the lower end of the column 38. The temperature of the gas may be previously cooled so as to increase the heat release efficiency. However, if the heat release efficiency is increased in excess, the temperature of the center portion of the electrode 38 is undesirably decreased too much.

Figure 19:
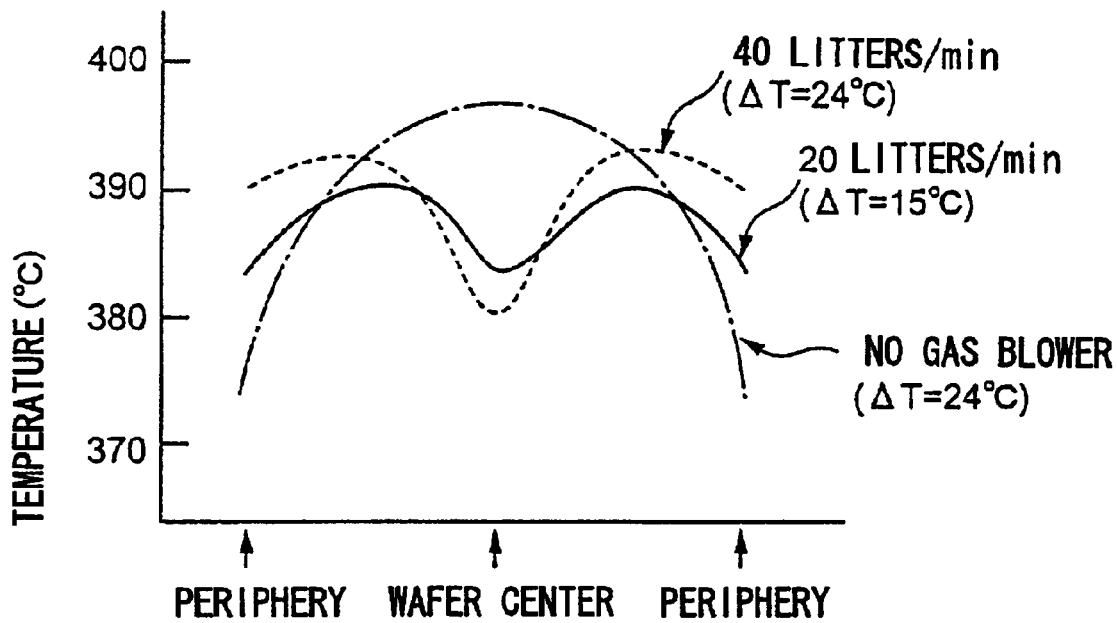
FIG. 19 is a graph showing a temperature distribution in a surface of a semiconductor wafer.
Figure 20:
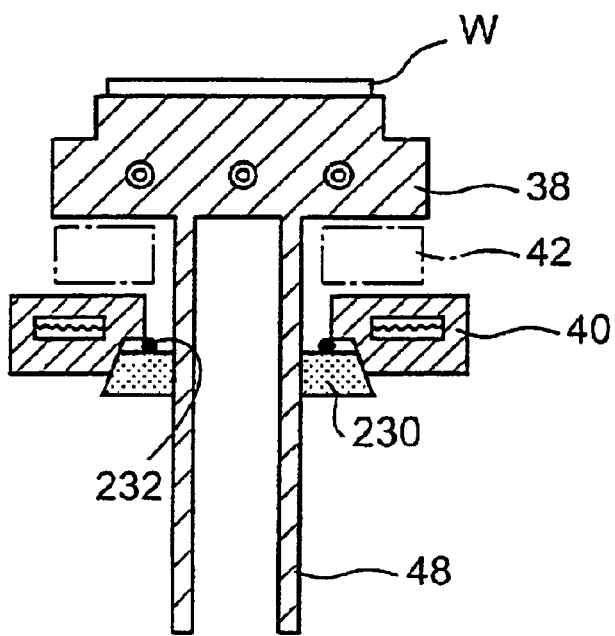
FIG. 20 is a view showing a state in which a column and a cooling block are connected to each other by a thermal conductive member.

FIG. 19 is a graph showing the effect of the cooling blower means, and showing a case in which the cooling blower means is not present and a state in which the cooling blower means is present (20 litters/min and 40 litters/min). The cooling blower means injects $N_2$ gas at a room temperature. Apparent from the graph shown in FIG. 19, when the cooling blower means is not present, the temperature of the wafer center is high and the temperature of the periphery is low. In this case, the temperature difference $\Delta T$ in the surface of the wafer is so large that it reaches 24° C.

When the cooling blower means is present and the gas is injected at a flow rate of 40 litters/min, the heat release is promoted in excess and the temperature of the center of the wafer is low. Also in this case, the temperature difference $\Delta T$ in the surface of the wafer is so large that it reaches 24° C.

On the other hand, when the cooling blower means is present and the gas is injected at a flow rate of 20 litters/min, the temperature of the wafer center is appropriately reduced. Accordingly, the temperature difference $\Delta T$ is reduced to about 15° C., and the uniformity of the temperature in the wafer surface shows a good result.

As mentioned above, the uniformity of the temperature in the wafer surface can be greatly improved by promoting the heat release by infecting the gas toward the center portion of the lower surface of the lower electrode unit 38.

In the above-mentioned embodiment, the heat release of the center portion of the lower electrode unit 38 is promoted by providing the gas blower means 220. However, instead of or in combination with the blower means, the members may be Joined via a thermal conductive member 230 made of, for example, aluminum or the like positioned between the column 48 and the cooling block 40. It should be noted that the reference numeral 232 indicates a seal member such as an O-ring, which maintains the airtightness of the process chamber.

Accordingly, the heat in the lower electrode unit 38 is transferred to the cooling block 40 via the column 48 and the heat conductive member 230. Accordingly, similar to the case described with reference to FIG. 18, the heat release of the center portion of the lower electrode unit 38 is increased, and the uniformity of the temperature in the wafer surface can be increased.

It should be noted that in the above-mentioned embodiment, the beat resistant metal seal members shown in FIGS. 3A through 3E are used so as to seal each of the heat transfer spaces. However, the present invention is not limited to this, and the heat transfer spaces themselves may constitute a labyrinth structure so that the heat transfer gas does not move out therefrom. In one embodiment, a labyrinth heat transfer space formed by complementary concentric or spiral grooves is provided on opposite surfaces of the electrode unit and the cooling block.

Figure 21:
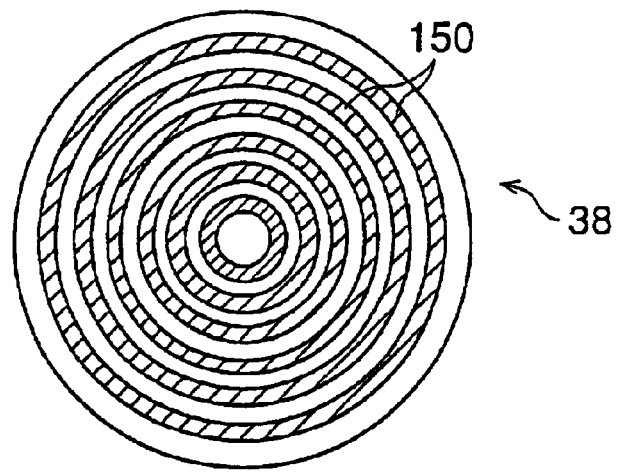
FIG. 21 is a plane view of a variation of a groove of the lower electrode unit.
Figure 22A:
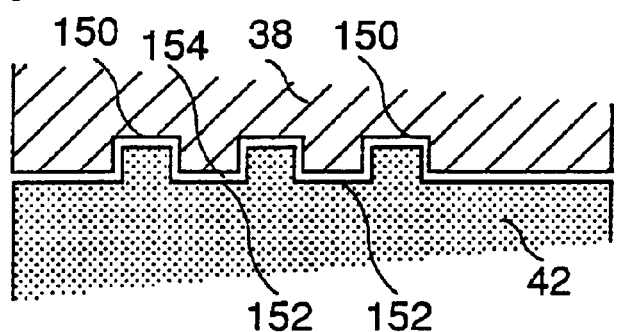
FIGS. 22A and 22B are enlarged cross-sectional view showing a labyrinth heat transfer space.
Figure 22B:
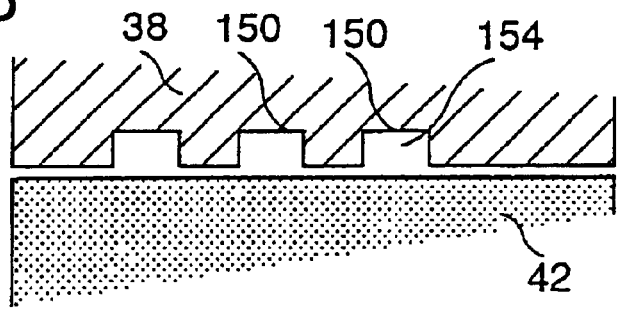

A description will now be given of this point by taking the Joint part between the lower electrode unit 38 and the lower insulating member 42 for instance. As shown in FIG. 21 and FIGS. 22A and 22B, small grooves 152, each of which has a width of 2 mm, are formed on the lower surface of the lower insulating member 42 with a predetermined pitch, for example, several millimeters in a spiral arrangement or a concentric arrangement (the example shown in FIG. 21 is the concentric arrangement). Additionally, small grooves 152 are formed on the upper surface of the lower insulating member 42, which faces the lower insulating member 42, so that the convexo-concave structure formed by the grooves 152 fits to the convexo-concave structure formed by the grooves 150. That is, a labyrinth heat transfer space 154 is formed by arranging the grooves 150 and 152 as shown in FIG. 22A. In this case, the heart transfer gas can be confined in the labyrinth heat transfer space 154 in a certain degree without using the heat resistant metal seal member.

Additionally, as shown in FIG. 22B, the grooves 150 may be formed on only one of the surfaces, that is, on the lower electrode unit 38 in the example shown in the figure, and the other surface opposite to the one of the surfaces may be made flat. Although the labyrinth heat transfer space 154 formed in this case cannot provide the sealing characteristic of the level the same as that shown in FIG. 22A, the heat transfer gas can be confined in a certain degree.

Figure 23:
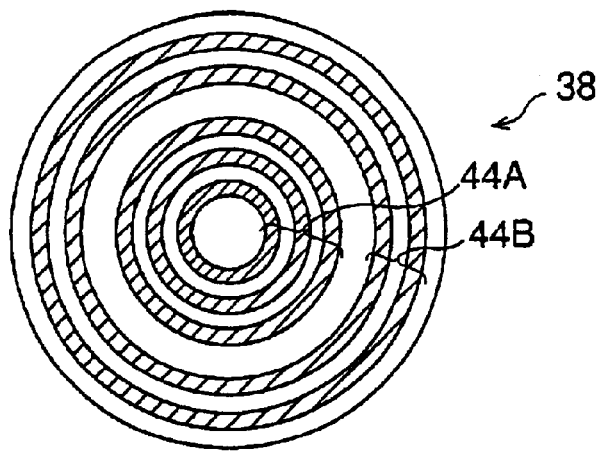
FIG. 23 is a view showing a variation of a heater unit.

Additionally, in the above-mentioned embodiment, although each of heater units 44 and 116 is formed by a sheath heater, each of the heater units may be constituted by a ceramic heater, which is formed, for example, by patterning a resistor metal in ceramics. Additionally, the heater units 44 and 116 may be divided into two zones such as the center side heater unit 44A and outer side heater unit 44B as shown in FIG. 23 so that the temperature control can be performed on an individual zone basis. Additionally, in the case of the ceramic heater, a control the same as the control of heat generation on an individual zone basis can be achieved by increasing or decreasing the width of the patterned resistor in the middle of the concentric arrangement or the spiral arrangement.

Further, in the present embodiment, the insulating members 42 and 114 are provided between the electrode units 38 and 110 and the cooling blocks 40 and 112, respectively. However, the insulating members 42 and 114 are not necessarily provided, and the electrode units 38 and 110 may be directly joined to the respective cooling blocks 40 and 112. In such as case, a small heat transfer space is also formed in the boundary of the Joined surfaces. It should be noted that, in this case, insulation between the process chamber 26 and each of the electrode structures is provided at different positions.

Figure 24:
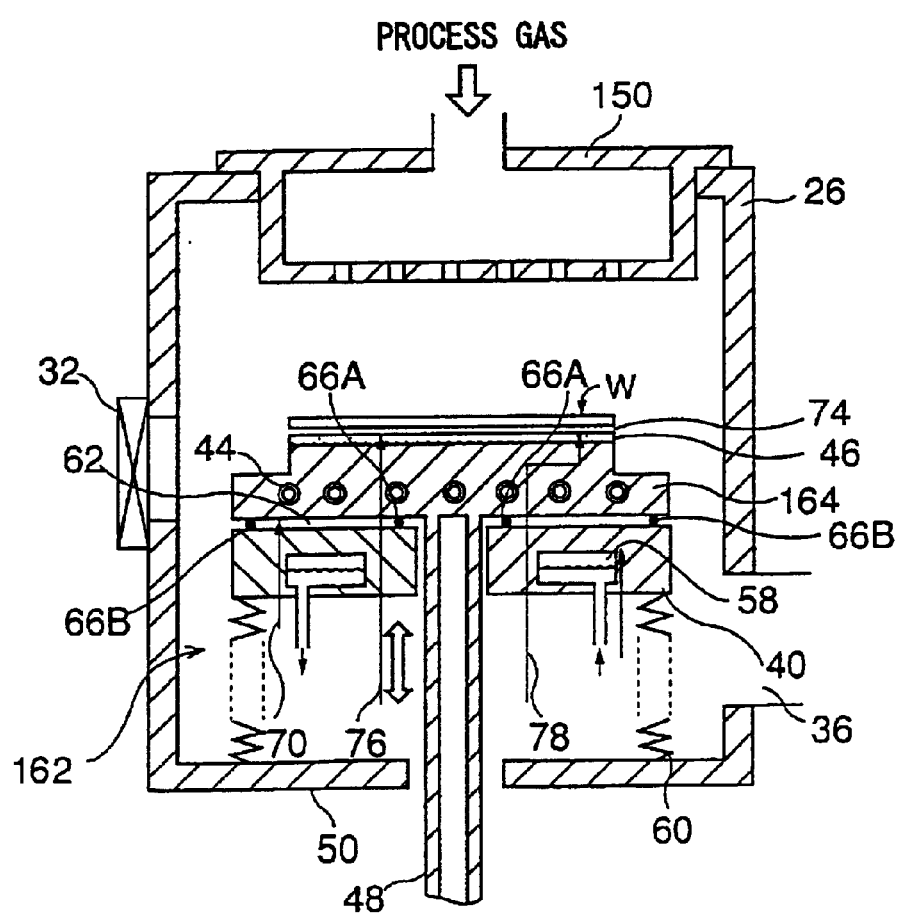
FIG. 24 is a structural view of a thermal CVD processing apparatus according to the present invention.

Additionally, although the description was given by taking the plasma CVD process for instance in the above-mentioned embodiment, the present invention may be applied to other processes such as a plasma etching process, a plasma sputtering process, a plasma ashing process or a heat CVD process which does not use a plasma. FIG. 24 shows a processing apparatus as an example to which the present invention is applied to a heat CVD processing apparatus that does not use plasma. It should be noted that, in FIG. 24, parts that are the same as the parts shown in FIG. 2 are given the same reference numerals.

In this figure, a showerhead unit 150 is provided instead of the gas nozzle shown in FIG. 2, which showerhead unit 150 supplies the process gas such as a film deposition gas to the interior of the process chamber 26, and a placement table structure 162 is provided instead of the lower electrode structure 28 shown in FIG. 2. The placement table structure 162 comprises the cooling block 40 and a placement table 164 that has the same structure as the lower electrode unit 38 shown in FIG. 2. The heat resistant metal seal members 66A and 66B are provided in the heat transfer space 62 between the placement table 162 and the cooling block 40. Since the high-frequency power source is not used, the lower insulating member 42 provided in the apparatus shown in FIG. 2 is not needed. In this case, action and effect similar to that of the apparatus shown in FIG. 2 can be provided. For example, the effect that a temperature of an object to be processed can be accurately controlled can be provided without consuming a large amount of heat transfer gas by maintaining high sealing characteristic to the heat transfer space.

It can be realized that the modes of the examples described with reference to FIGS. 7 through FIG. 20 can be applied to the placement table structure using the labyrinth heat transfer space 154 and the placement table structure 162 that does not use a high-frequency power source.

Further, although the description was given by taking the semiconductor wafer as an object to be processed for example, the present invention is not limited to this and is applicable to an LCD substrate, a glass substrate or the like.

As mentioned above, the electrode structure, the placement table structure, the plasma processing apparatus and the processing apparatus according to the present invention can provide the following excellent effects.

According to the electrode structure of the present invention, a high sealing effect for the heat transfer apace can be maintained in a high temperature range such as a temperature, for example, ranging from 350° C. to 500° C., which is higher than 200° C.

Especially, in a case in which the pressure in the heat transfer space or the labyrinth heat transfer space, which is a target to be controlled, is measured by the heat resistant pressure sensor, a rapid and accurate pressure control can be performed.

Additionally, according to the placement table structure of the present invention, a high sealing effect for the heat transfer apace can be maintained in a high temperature range such as a temperature higher than 200° C. or, for example, a range from 350° C to 500° C. so as to accurately control a temperature of the object to be processed without consuming a large amount of heat transfer gas.

Especially, in a case in which the pressure in the heat transfer space or the labyrinth heat transfer space, which is a target to be controlled, is measured by the heat resistant pressure sensor, a rapid and accurate pressure control can be performed.

Additionally, by setting the coefficient of thermal conductivity of the insulating member to be more than 80 W/mK, the warp deformation can be controlled and the uniformity of a temperature distribution in a surface of the object to be processed can be improved.

Additionally, according to the present invention, by setting the contact rate of the joining surfaces that define the heat transfer space to fall within a range from 40% to 80%, the uniformity of a temperature distribution in a surface of the object to be processed can be further improved since the heat transfer gas can flow substantially uniformly within the surface without excessively increasing the heat resistance.

Additionally, according to the present invention, by setting the surface roughness of the member defining the heat transfer space to be smaller than 2.0 im, the heat conductivity can be improved and the controllability of the temperature of the object to be processed can be improved.

Additionally, according to the present embodiment, by forming the soft metal film or layer made of a low melting point material, which is softened at a process temperature of the object to be processed, on the surface of the heat resistant metal seal member or the surface of the member contacting the heat resistant metal seal member, a cut in the surface which contacts the seal member is filled by the softened material which eliminates a leak path, thereby enabling prevention of the heat transfer gas from leaking through the cut.

Additionally, according to the present invention, by injecting a gas toward the electrode unit or the center portion of the back surface of the placement table from inside the hollow column which supports the electrode unit or the placement table, a release of heat from such a portion can be promoted and the uniformity of the temperature distribution in the surface of the object to be processed.

Further, according to the plasma processing apparatus of the present invention, a plasma process can be performed with an accurate control of the temperature of an object to be processed in a high temperature rage.

Additionally, according to the processing apparatus of the present invention, a process can be performed with an accurate control of the temperature of an object to be processed in a high temperature rage.

The present invention is not limited to the specifically disclosed embodiments, and variations and modifications may be made without departing from the scope of the present invention.

What is claimed is:

1. An electrode structure used in a plasma processing apparatus which performs a predetermined process on an object to be processed by using a plasma in a process chamber in which a vacuum can be formed, the electrode structure comprising:
    an electrode unit having a heater unit therein;
    a cooling block joined to the electrode unit and having a cooling jacket which cools said electrode unit;
    a labyrinth beat transfer space formed by a complementary concentric or spiral grooves provided on opposite surfaces of said electrode unit and said cooling block; and
    an electrode-side heat transfer gas supply structure configured to supply a heat transfer gas to said labyrinth heat transfer space.

2. The electrode structure as claimed in claim 1, further including an insulating member provided between said electrode unit and said cooling block, and wherein said heat transfer space is divided into an upper space and a lower space by the thermally insulating member.

3. The electrode structure as claimed in claim 2, wherein said thermally insulating member is made of a material having a coefficient of thermal conductivity of more than 80 W/mK at a process temperature of said object to be processed.

4. The electrode structure as claimed in claim 1, wherein a surface roughness of a member defining said heat transfer space is smaller than 2.0 µm.

5. The electrode structure as claimed in claim 1, wherein said heater unit is a ceramic heater.

6. The electrode structure as claimed in claim 1, wherein said electrode unit is an upper electrode unit positioned above said object to be processed.

7. A placement table structure used for a processing apparatus performing a predetermined process on an object to be processed in a process chamber in which a vacuum can be formed, the placement table structure comprising:
    a placement table having a heater unit therein so as to heat said object to be processed;
    a cooling block joined to the placement table and having a cooling jacket which cools said placement table;
    a labyrinth heat transfer space formed by complementary concentric or spiral grooves provided on opposite surfaces of said placement table and said cooling block; and
    a heat transfer gas supply structure configured to supply a heat transfer gas to said labyrinth heat transfer space.

8. The placement table structure as claimed in claim 7, wherein a surface roughness of a member defining said heat-transfer space is smaller than 2.0 µm.

9. The placement table structure as claimed in claim 7, wherein the center of said placement table is held by a column, and the column is connected to said cooling block via a heat conductive member.

10. An electrode structure used in a plasma processing apparatus which performs a predetermined process on an object to be processed by using a plasma in a process chamber in which a vacuum can be formed, the electrode structure comprising:
    an electrode unit having a heater unit therein;
    a cooling block joined to the electrode unit and having a cooling jacket which cools said electrode unit;
    a labyrinth heat transfer space formed by complementary concentric or spiral grooves provided on opposite surfaces of said electrode unit and said cooling block;
    an electrode-side heat transfer gas supply structure configured to supply a heat transfer gas to said labyrinth heat transfer space; and an aluminum nitride (AlN) thermally insulating member provided between said electrode unit and said cooling block, the heat transfer space being divided into an upper space and a lower space by the thermally insulating member, said thermally insulating member having a coefficient of thermal conductivity of more than 80 W/mK at a process temperature of said object to be processed.

11. An electrode structure used in a plasma processing apparatus which performs a predetermined process on an object to be processed by using a plasma in a process chamber in which a vacuum can be formed, the electrode structure, comprising:

an electrode unit having a heater unit therein;

a cooling block joined to the electrode unit and having a cooling jacket which cools said electrode unit;

a labyrinth heat transfer space formed by complementary concentric or spiral grooves provided on opposite surfaces of said electrode unit and said cooling block; and an electrode-side heat transfer gas supply structure configured to supply a heat transfer gas to said labyrinth heat transfer space, wherein a contact rate of a joining surface of a member, which is joined to define said heat transfer space, is set to fall within a range from 40% to 80%.

12. An electrode structure used in a plasma processing apparatus which performs a predetermined process on an object to be processed by using a plasma in a process chamber in which a vacuum can be formed, the electrode structure comprising:

an electrode unit having a heater unit therein;

a cooling block joined to the electrode unit and having a cooling jacket which cools said electrode unit;

a labyrinth heat transfer space formed by a complementary concentric or spiral grooves provided on opposite surfaces of said electrode unit and said cooling block; and an electrode-side heat transfer gas supply structure configured to supply a heat transfer gas to said labyrinth heat transfer space, wherein said heater unit is divided into concentric zones, and the divided zones are controllable on an individual basis.

13. An electrode structure used in a plasma processing apparatus which performs a predetermined process on an object to be processed by using a plasma in a process chamber in which a vacuum can be formed, the electrode structure comprising:

an electrode unit having a heater unit therein;

a cooling block joined to the electrode unit and having a cooling jacket which cools said electrode unit;

a labyrinth heat transfer space formed by complementary concentric or spiral grooves provided on opposite surfaces of said electrode unit and said cooling block; and an electrode-side heat transfer gas supply structure configured to supply a heat transfer gas to said labyrinth heat transfer space, wherein said electrode unit is a lower electrode unit which also serves as a placement table on which said object to be processed is placed, and the electrode structure further comprises an electrostatic chuck which is joined to an upper surface of the lower electrode unit so as to attract said object to be processed and a chuck-side heat transfer gas supply structure configured to supply a heat transfer gas to a chuck-side heat transfer space formed between said electrostatic chuck and said object to be processed.

14. The electrode structure as claimed in claim 13 wherein at least one of said electrode side heat transfer space, said labyrinth heat transfer space and said chuck-side heat transfer space is provided with a heat resistant pressure sensor, and an amount of gas supplied by said corresponding heat transfer gas supply structure is controlled based on an output of the heat resistant pressure sensor.

15. An electrode structure used in a plasma processing apparatus which performs a predetermined process on an object to be processed by using a plasma in a process chamber in which a vacuum can be formed, the electrode structure comprising:

an electrode unit having a heater unit therein;

a cooling block joined to the electrode unit and having a cooling jacket which cools said electrode unit;

a labyrinth heat transfer space formed by complementary concentric or spiral grooves provided on opposite surfaces of said electrode unit and said cooling block; and an electrode-side heat transfer gas supply structure configured to supply a heat transfer gas to said labyrinth heat transfer space, wherein the center of said electrode unit is held by a hollow column, and a gas blower is provided in said column for promoting a release of heat by blowing a gas toward the center of a back surface of said electrode unit.

16. A placement table structure used for a processing apparatus performing a predetermined process on an object to be processed in a process chamber in which a vacuum can be formed, the placement table structure comprising:

a placement table having a heater unit therein so as to heat said object to be processed;

a cooling block joined to the placement table and having a cooling jacket which cools said placement table;

a labyrinth heat transfer space formed by a complementary concentric or spiral grooves provided on opposite surfaces of said placement table and said cooling block; and a heat transfer gas supply structure configured to supple a heat transfer gas to said labyrinth heat transfer space, wherein a rate of contact of a joining surface of a member joined to define said heat transfer space is set to fall within a range from 40% to 80%.

17. The placement table structure as claimed in claim 16, wherein a surface roughness of a member defining said heat-transfer space is smaller than 2.0 μm.

18. A placement table structure used for a processing apparatus performing a predetermined process on an object to be processed in a process chamber in which a vacuum can be formed, the placement table structure comprising:

a placement table having a heater unit therein so as to heat said object to be processed;

a cooling block joined to the placement table and having a cooling jacket which cools said placement table;

a labyrinth heat transfer space formed by complementary concentric or spiral grooves provided on opposite surfaces of said placement table and said cooling block; and a heat transfer gas supply structure configured to supply a heat transfer gas to said labyrinth heat transfer space, wherein the center of said placement table is held by a hollow column, and a gas blower is provided in said column for promoting a release of heat by blowing a gas toward the center of a back surface of said electrode unit.

19. A plasma processing apparatus comprising:

a process chamber in which a vacuum can be formed;

an electrode structure recited in one of claims 1, 2, 3, 4, 5, 6, 10, 11, 12, 13, 14 and 15; and a high-frequency source applying a high-frequency voltage to the electrode structure.

20. A processing apparatus comprising:

a process chamber in which a vacuum can be formed; and a placement table structure recited in one of claims 7, 8, 9, 16, 18, and 17.

\* \* \* \* \*